United States Patent
Lutgen et al.

(10) Patent No.: US 10,847,675 B2
(45) Date of Patent: *Nov. 24, 2020

(54) MICRON-SIZED LIGHT EMITING DIODE DESIGNS

(71) Applicant: Facebook Technologies, LLC, Menlo Park, CA (US)

(72) Inventors: Stephan Lutgen, Dresden (DE); David Massoubre, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/598,498

(22) Filed: Oct. 10, 2019

(65) Prior Publication Data

US 2020/0127159 A1    Apr. 23, 2020

Related U.S. Application Data

(63) Continuation of application No. 15/968,359, filed on May 1, 2018, now Pat. No. 10,483,430.

(51) Int. Cl.
*H01L 33/60* (2010.01)
*H01L 33/06* (2010.01)
(Continued)

(52) U.S. Cl.
CPC .......... *H01L 33/06* (2013.01); *H01L 33/0083* (2013.01); *H01L 33/10* (2013.01);
(Continued)

(58) Field of Classification Search
CPC ..... H01L 33/06; H01L 33/0083; H01L 33/10; H01L 33/16; H01L 33/20
(Continued)

(56) References Cited

U.S. PATENT DOCUMENTS 6,258,616 B1    7/2001  Cunningham et al.
10,483,430 B1 * 11/2019  Lutgen .................... H01L 33/20
(Continued)

FOREIGN PATENT DOCUMENTS

| EP | 1620902 | 2/2006 |
|---|---|---|
| GB | 2541970 A | 3/2017 |
| KR | 10-2017-0036292 A | 4/2017 |

OTHER PUBLICATIONS

European Patent Office, Extended European Search Report, European Patent Application No. 18204692, dated May 10, 2019, 8 pages.
(Continued)

*Primary Examiner* — Elias Ullah
(74) *Attorney, Agent, or Firm* — Fenwick & West LLP

(57) ABSTRACT

A emitting diode (LED) includes an epitaxial structure defining a base and a mesa on the base. The base defines a light emitting surface of the LED and includes current spreading layer. The mesa includes a thick confinement layer, a light generation area on the thick confinement layer to emit light, a thin confinement layer on the light generation area, and a contact layer on the thin confinement layer, the contact layer defining a top of the mesa. A reflective contact is on the contact layer to reflect a portion of the light emitted from the light generation area, the reflected light being collimated at the mesa and directed through the base to the light emitting surface. In some embodiments, the epitaxial structure grown on a non-transparent substrate. The substrate is removed, or used to form an extended reflector to collimate light.

20 Claims, 20 Drawing Sheets

(51) Int. Cl.
  *H01L 33/10* (2010.01)
  *H01L 33/00* (2010.01)
  *H01L 33/46* (2010.01)
  *H01L 33/20* (2010.01)
  *H01L 33/28* (2010.01)
  *H01L 33/16* (2010.01)
(52) U.S. Cl.
  CPC .............. *H01L 33/16* (2013.01); *H01L 33/20* (2013.01); *H01L 33/285* (2013.01); *H01L 33/46* (2013.01); *H01L 33/60* (2013.01)
(58) Field of Classification Search
  USPC ......................................................... 257/98
  See application file for complete search history.

(56) References Cited

U.S. PATENT DOCUMENTS

| | | |
|---|---|---|
| 2003/0232455 A1 | 12/2003 | Tanaka |
| 2007/0138487 A1 | 6/2007 | Watanabe et al. |
| 2013/0049005 A1 | 2/2013 | Chua et al. |
| 2015/0179904 A1 | 6/2015 | Maaskant et al. |

OTHER PUBLICATIONS

PCT International Search Report and Written Opinion, PCT Application No. PCT/US2018/035480, dated May 31, 2018, 2018, sixteen pages.

\* cited by examiner

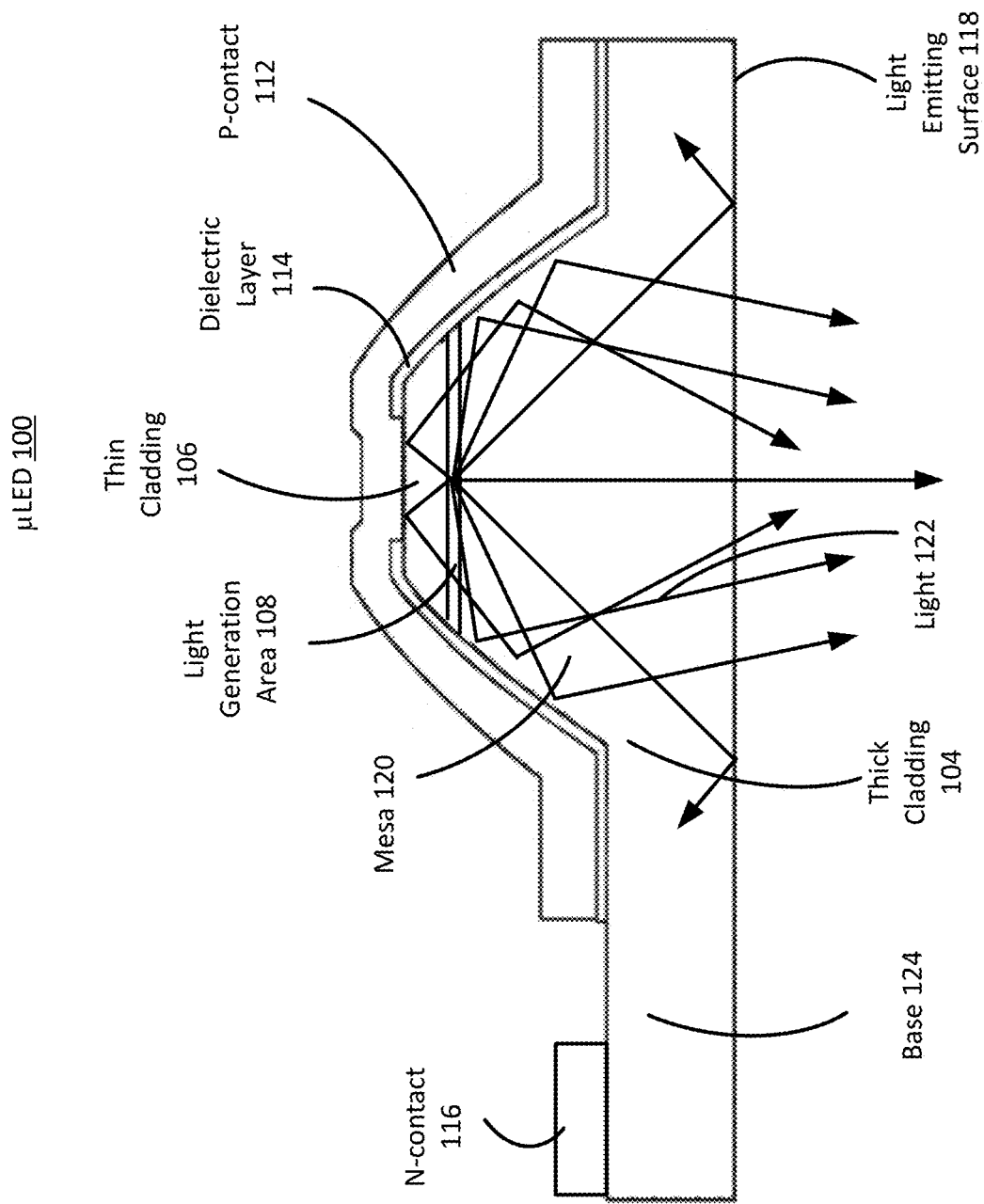

200

```
┌─────────────────────────────────────────────────────────┐
│ Form a semiconductor structure including a substrate    │
│ and an epitaxial structure on the substrate             │
│                           210                           │
└─────────────────────────────────────────────────────────┘
                            ↓
┌─────────────────────────────────────────────────────────┐
│ Etch the epitaxial structure from thin cladding to      │
│ current spreading layer, or from thin cladding to etch  │
│ stop layer on the current spreading layer, to form a    │
│ mesa and a base                                         │
│                           220                           │
└─────────────────────────────────────────────────────────┘
                            ↓
┌─────────────────────────────────────────────────────────┐
│ Form a dielectric layer and a p-contact on the mesa     │
│ and an n-contact on the base                            │
│                           230                           │
└─────────────────────────────────────────────────────────┘
                            ↓
┌─────────────────────────────────────────────────────────┐
│ Seperate the substrate from the epitaxial structure to  │
│ expose a light emitting surface of the epitaxial        │
│ structure defining a light emitting region              │
│                           240                           │
└─────────────────────────────────────────────────────────┘
                            ↓
┌─────────────────────────────────────────────────────────┐
│ Form an extended reflector in the base of the epitaxial │
│ structure below the mesa to reflect at least a portion  │
│ of light from the MQW toward the light emitting surface │
│                           250                           │
└─────────────────────────────────────────────────────────┘
```

Manufacture a mLED including a semiconductor structure having a substrate and an epitaxial structure defining a light emitting surface
710

Remove a portion of the substrate to form a light reflector shape in the substrate for light emitted from a light emitting region of the light emitting surface
720

Form a reflective material on a surface of the substrate defining the light reflector shape to collimate the light transmitted from the light emitting surface
730

FIG. 7

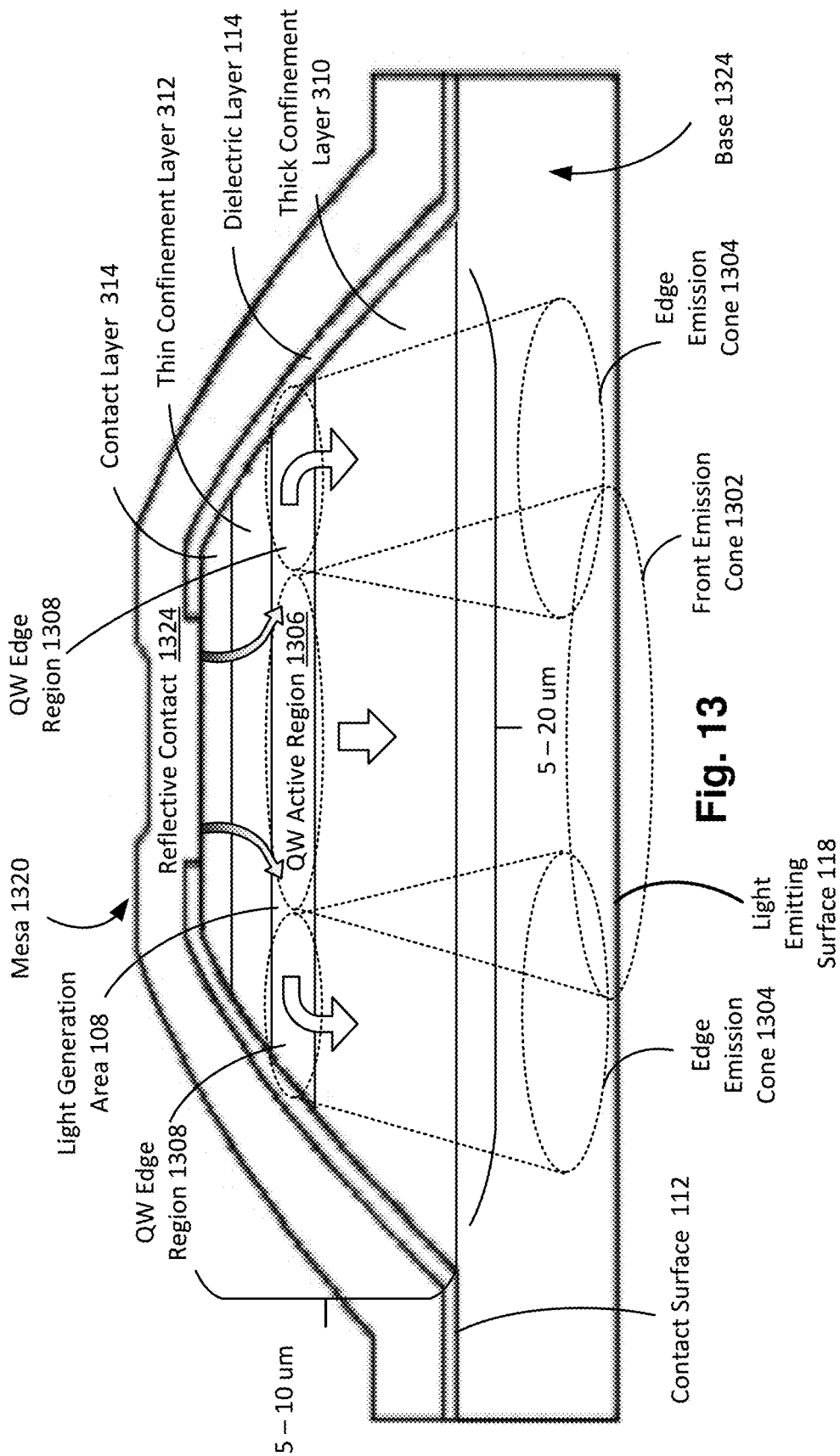

MICRON-SIZED LIGHT EMITING DIODE DESIGNS

CROSS REFERENCE TO RELATED APPLICATIONS

This application is a continuation of co-pending U.S. application Ser. No. 15/968,359, filed May 1, 2018, which is incorporated by reference in its entirety.

BACKGROUND

The efficiency of light emitting diodes (LED) depends typically on wavelengths (green gap), junction temperature Tj and current density. An advantage of small (mini/micro) LEDs is good internal 3D-heat spreading (e.g., <60 µm diameter) and low Tj. This explains the higher efficiency at higher current density and longer device lifetime of small LEDs. For the application of even smaller µLEDs (e.g., <10 µm) like in 2D displays for augmented reality (AR) at lower drive current (e.g., 1 nA-1 µA) or 1D scanning at higher drive current (e.g., 1-300 µA) there is a different loss mechanism at different current density and size of µLEDs. For µLEDs using low current density (e.g., less than 1 uA/mm$^2$), the efficiency can be less than 5%. In contrast, larger power LEDs can operate at up to 60% efficiency, and at medium current densities of more than 0.35 A/cm$^2$. µLED operation may be improved by reducing non-radiative recombination in the epitaxial structure and surface recombination losses at etched mesa facets, and increasing light extraction efficiency (LEE) while operating at the low (2D display) or very high (1D-array) current density.

SUMMARY

Embodiments related to LEDs, such as µLEDs, having high LEE at low or high current densities. A LED includes an epitaxial structure defining a base and a mesa on the base. The base defines a light emitting surface of the micro-LED and includes current spreading layer. The mesa includes a thick confinement layer, a light generation area (e.g., including a multi-quantum well (MQW)) on the thick confinement layer to emit light, a thin confinement layer on the light generation area, and a contact layer on the thin confinement layer, the contact layer defining a top of the mesa. A reflective contact is on the contact layer to reflect a portion of the back emitted light from the light generation area. Lateral travelling light from the light generation area is reflected (by 90° at parabolic mesa) at the mesa facet and the reflective contact (or other reflector layers) and directed through the base (as a collimated beam, such as for parabolic or conical reflector type) to the light emitting surface.

Some embodiments relate to manufacturing a LED by growing an epitaxial structure on a substrate. The epitaxial structure includes a current spreading layer, a thick confinement layer, a thin confinement layer, a light generation area between the thick confinement layer and the thin confinement layer, and a contact layer. A base and a mesa on the base are formed in the epitaxial structure. The base defines a light emitting surface of the LED and includes the current spreading layer. The mesa includes the thin confinement layer, the light generation area, and the contact layer defining a top of the mesa. A reflective contact is formed on the contact layer to reflect a portion of the light emitted from the light generation area, the reflected light being collimated at the mesa and directed through the base to the light emitting surface.

BRIEF DESCRIPTION OF THE DRAWINGS

FIG. 1 is a cross-sectional diagram of a micro-LED (µLED), in accordance with one embodiment.

FIG. 2 is flowchart of a process for manufacturing a µLED, in accordance with one embodiment.

FIG. 7 is a flowchart of a process for manufacturing a µLED with an extended substrate reflector, in accordance with one embodiment.

FIG. 13 is a cross-sectional diagram of a mesa of a µLED, in accordance with one embodiment.

DETAILED DESCRIPTION

Figure 3A:
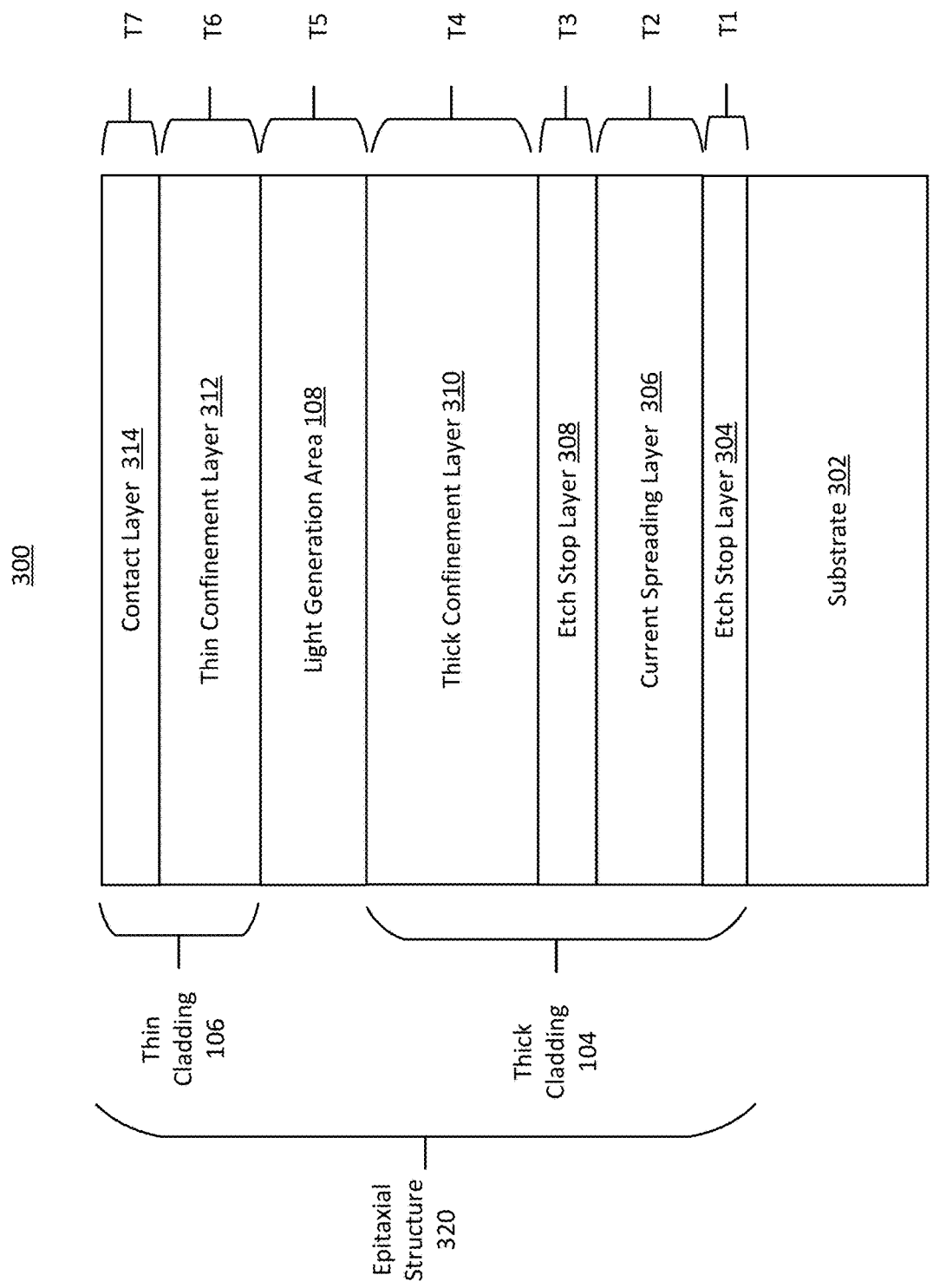
FIGS. 3A through 3D show a semiconductor structure and a µLED manufactured from the semiconductor structure, in accordance with one embodiment.

Embodiments relate to manufacturing a micro-LED on a non-transparent substrate (e.g., gallium arsenide (GaAs) substrate for red color LED) on which an epitaxial structure is grown. The epitaxial structure may define a mesa on a base. The base includes a thin confinement layer at the top of the mesa, a light generation area (e.g., multi-quantum wells, quantum dots, quantum wire, nano-wire, or nano-fin-walls), and a thick confinement layer at the bottom of the mesa. A reflective contact is on the mesa to reflect a portion of the light emitted from the light generation area, the reflected light being collimated at the mesa and directed through the base to the light emitting surface. The mesa may be etched into various shapes to facilitate the collimation of the reflected light, such as parabolic with truncated top, conic with truncated top, or cylindrical with truncated top. The substrate may be removed after formation of the µLED to expose the light emitting surface.

The micro-LED, "µLED," or "MicroLED," as described herein refers to a particular type of light emitting diode having a small active light emitting area, such as between 0.2-10 µm, 10-100 µm or 100-2000 µm in diameter. In one example, the diameter includes 2.5-30 µm of rectangular or circular diameter for a parabolic, conical, or super-parabolic top head profile of the μLED.

Overview of Example Micro-LED

FIG. 1 is a schematic diagram of a cross section of a micro-LED 100 (hereinafter referred to as "μLED"), in accordance with one embodiment. The μLED 100 may include, among other components, a semiconductor structure including a thick cladding 104, a thin cladding 106, and a light generation area 108 between the thick cladding 104 and the thin cladding 106. The μLED 100 further includes a dielectric layer 110 on the semiconductor structure, a p-contact 112 on the dielectric layer 114, and an n-contact 116 on the thick cladding 104. The semiconductor structure is shaped, such as via an etch process, into a mesa 120 and a base 124 of the mesa 120. The light generation area 108 is an active light generation area that is included in the structure of the mesa 120. The active light generation area may include quantum wells, quantum dots, quantum wire, nano-wire, or nano-fin-walls. The mesa 120 may include a truncated top defined on a side opposed to a light emitting surface 118 of the μLED 100. In some embodiments, the semiconductor structure including the thick cladding 104, light generation area 108, and thin cladding 106 define an epitaxial structure grown on a substrate. The thin cladding 106 and the thick cladding 104 includes differently doped semiconductor material layers. For example, the thin cladding 106 may include p-doped semiconductor material layers and the thick cladding 104 may include n-doped semiconductor material layers.

In another example, the thin cladding 106 may include n-doped semiconductor material layers and the thick cladding 104 may include p-doped semiconductor material layers. Here, the p-contact 112 is an n-contact and the n-contact 116 is a p-contact.

If the semiconductor structure of the μLED 100 is grown on a substrate, such as a non-transparent substrate, the substrate may be removed to reveal the light emitting surface 118. In another example, a portion of the substrate is removed to form a parabolic light reflector that further collimates light transmitted from the light emitting surface 118.

The mesa 120 may include various shapes, such as a parabolic shape with a truncated top, to form a reflective enclosure for light 122 generated within the μLED 100. In other embodiments, the mesa 120 may include a cylindrical shape with a truncated top, or a conic shape with a truncated top. The arrows show how the light 122 emitted from the light generation area 108 is reflected off the p-contact 112 and internal walls of the mesa 120 toward the light emitting surface 118 at an angle sufficient for the light to escape the μLED device 100 (i.e., within a critical angle of total internal reflection). The p-contact 112 and the n-contact 116 connect the μLED 100, such as to a display substrate including a control circuit for the μLED 100. The n-contact is formed at the base 124, which is defined by a surface of the thick cladding 104 opposite the light emitting surface 118.

The μLED 100 may include an active light emitting area defined by the light generation area 108. The μLED 100 directionalizes the light output from the light generation area 108 and increases the brightness level of the light output. In particular, the mesa 120 and p-contact 112 cause reflection of the light 122 from the light generation area 108 to form a collimated or quasi-collimated light beam emerging from the light emitting surface 118.

The mesa 120 may be formed by etching into a semiconductor structure, including the thick cladding 104, the light generation area 108, and the thin cladding 106, during wafer processing steps. The etching results in the light generation area 108 being in the structure of the mesa 120, and at a particular distance to the p-contact 112 to facilitate the collimation of the light 122. A portion of the generated light 122 is reflected at the mesa 120 to form the quasi-collimated light beam emitted from the light emitting surface 118. In some embodiments, the mesa 120 is between 10 and 400 um in height and between 30 and 400 um in width.

μLED Manufacturing with Substrate Removal

FIG. 2 is a flowchart of a process 200 for manufacturing a μLED, in accordance with one embodiment. The process 200 may be performed to manufacture a μLED where the growth substrate is non-transparent (e.g., for the light emitted by the μLED, such as red color LEDs fabricated on GaAs substrates) and removed to expose the light emitting surface of the epitaxial structure. Some examples of non-transparent substrates include the gallium arsenide (GaAs) substrate for the red color LEDs, or silicon (Si) substrate for gallium nitride (Gan)-on-Si based blue and green color LEDs.

The process 200 is discussed with reference to FIGS. 3A, 3B, 3C, and 3D, which show manufacturing of a μLED 300, in accordance with one embodiment. In some embodiments, after substrate removal, an extended reflector is defined in the epitaxial structure around a light emitting region of the light emitting surface of the μLED to collimate light. The process 200 is also discussed with reference to FIGS. 4A, 4B, and 4C, which respectively a show cross sectional side view, a top view, and a bottom view of a μLED 400 including the extended reflector defined in the epitaxial structure, in accordance with one embodiment.

The semiconductor structure 300 is formed 210 including a substrate and an epitaxial structure on the substrate. The semiconductor structure 300 is an initial structure that is etched to form the mesa of an LED such as the μLED 100. In some embodiments, the substrate may be a non-transparent substrate, such as a gallium arsenide (GaAs) substrate. The epitaxial structure may include semiconductor layers grown on the substrate, such as the thick cladding 104, the light generation area 108, and the thin cladding 106 of the μLED 100. As discussed in greater detail below, the substrate, or a portion of the substrate, may be removed to expose the light emitting face 118 of the μLED 100. The epitaxial structure may be grown using techniques such as Molecular Beam Epitaxy (MBE, PAMBE) or Metalorganic Chemical Vapor Deposition (MOCVD).

FIG. 3A is a cross section of the semiconductor structure 300 for a μLED 100, in accordance with one embodiment. The semiconductor structure 300 can have layers of various example thicknesses and materials for different color μLEDs, such as red, infrared, green, blue, or ultraviolet μLEDs. The semiconductor structure 300 includes a substrate 302 and the epitaxial structure 320 including the thick cladding 104 on the substrate 302 defining n-type semiconductor layers, the light generation area 108 on the thick cladding 104, and the thin cladding 106 defining p-type semiconductor layers on the light generation area 108.

The substrate 302 may be an n-type substrate. For a red or infrared color μLED, the substrate 302 may be a GaAs substrate. The GaAs substrate is opaque for wavelengths less than 830 nanometers (nm), and is transparent for wavelengths larger than 850 nm. The substrate 302 may include a crystalline structure and may be sliced (e.g., six degrees off the <111> plane) to facilitate epitaxial growth on the surface of the substrate 302. In some embodiments, the orientation is between 0° and 20° in in different directions, for example 15° off towards <111> or <110>. For an ultraviolet (e.g., AlGaN-based), or blue-green (InGaN-based) color μLED, the substrate 302 may be a transparent substrate such as silicon carbide (SiC), sapphire, GaN or an absorbing substrate such as silicon (Si).

The thick cladding 104 includes the n-type layers of the semiconductor structure 300. The thick cladding 104 may include, among other layers, an etch stop layer ("ESL") 304, a current spreading layer 306, an ESL 308, and a thick confinement layer 310. The ESL 304 may be grown on the substrate 304, the current spreading layer 306 may be grown on the ESL 304, the ESL 308 may be grown on the current spreading layer 306, and the thick confinement layer 310 may be grown on the ESL 308.

In some embodiments, the ESL 304 has a thickness of T1, the current spreading layer 306 has a thickness of T2, the ESL 308 has a thickness of T3, and the thick confinement layer 310 has a thickness T4. In some embodiments, T1 is between 50 and 400 nm, such as 20-100 nm. T2 is between 50 and 6000 nm, such as 500-2000 nm. T3 is between 50 and 400 nm, such as 20-100 nm. T4 is between 100 and 6000 nm, such as 300-1000 nm. The thickness of these layers, as well as the other layers discussed herein, may vary, such as because of manufacturing tolerances or other parameter tunings.

Example materials and doping concentrations are discussed in greater detail below for the red or infrared μLEDs. The ESL 304 may be a gallium indium phosphide (GaInP) semiconductor etch-stop layer, with n-type silicon (Si) doping concentration between $0.3\times10^{18}$ cm$^{-3}$ and $9\times10^{18}$ cm$^{-3}$, such as $1\times10^{18}$ cm$^{-3}$. The ESL 304 may be used for selective removal of the GaAs substrate 302 to expose the light emitting surface 118 of the μLED 100. The ESL 304 may be used, for example, to selectively remove a portion of the substrate 302 to expose the light emitting region of the light emitting surface 118 and to form a parabolic light reflector in the substrate 302. In some embodiments, such as when the substrate 302 is entirely removed, the ESL 304 may be omitted. Here, the current spreading layer 306 may be grown on substrate 302 instead of the ESL 304.

The current spreading layer 306 may be an aluminum indium phosphide (AlInP) semiconductor layer, with n-type Si or Tellurium (Te) doping concentration of between $0.5\times 10^{18}$ cm$^{-3}$ and $10\times10^{18}$ cm$^{-3}$, such as $1\times10^{18}$ cm$^{-3}$-$5\times10^{18}$ cm$^{-3}$. The AlInP may be a solid solution of aluminum phosphide and indium phosphide defined by $Al_{0.51}In_{0.49}P$ (In-content for thicker layer choosen to be close to lattic matched GaAs-substrate growth for higher material quality). The current spreading layer 306 is a thick residual (e.g., 2 um) n-material layer to enhance current spreading in the μLED 100.

The ESL 308 may be a gallium indium phosphide (GaInP) semiconductor etch-stop layer, with n-type silicon (Si) doping concentration of $5\times10^{18}$ cm$^{-3}$. The ESL 308 may be used for selective etching from the thin cladding 106 to the thick cladding 104 to form the mesa 120 and the base 124. The n-contact 116 may be formed on the ESL 306, or the current spreading layer 304 (e.g., if the ESL 308 is omitted or etched away). In some embodiments, the ESL 308 may be omitted, and the thick confinement layer 310 is grown on the current spreading layer 306.

The thick confinement layer 310 may be an $Al_{0.51}In_{0.49}P$ semiconductor layer, with n-type Si or Te doping. In another example, the thick confinement layer 310 may be an aluminum gallium arsenide (AlGaAs) semiconductor layer, with n-type Si or Te doping. The thick confinement layer 310 provides a barrier material for the light generation area 108 to confine electrons/holes in the light generation area 108 and could be a combination of different materials like AlGaAs, AlInP, etc.

The light generation area 108 may include a multiple quantum wells, such as between three to ten quantum wells. The light generation area 108 may include a $Ga_{0.41}In_{0.59}P/(Al_{0.50}Ga_{0.50})_{0.51}In_{0.49}P$ hetereostructure. For example, the light generation area 108 may include tensile strained $Ga_{0.41}In_{0.59}P$ quantum wells (or lattice matched AlGaInP) each having a width between 5 to 10 nm. The wells are defined between $(Al_{0.50}Ga_{0.50})_{0.51}In_{0.49}P$ barriers each having a width between 5 to 10 nm. The $Ga_{0.41}In_{0.59}P$ wells have a narrower bandgap than the bandgap of the $(Al_{0.50}Ga_{0.50})_{0.51}In_{0.49}P$ barriers. In some embodiments, the light generation area 108 has a thickness of T5 between 0.05 and 0.2 um.

The thin cladding 106 includes the p-type layers of the semiconductor structure 300. The thin cladding 106 includes a thin confinement layer 312, and a contact layer 314. The thin confinement layer 312 may be an $Al_{0.51}In_{0.49}P$ semiconductor layer, with p-type magnesium (Mg) doping. In another example, the thin confinement layer 312 may be AlGaAs, with p-type zinc (Zn) or Carbon (C) doping. The thin confinement layer 314, like the thick confinement layer 310, provides a barrier material for the light generation area 108 to confine electrons in the light generation area 108. However, the thin confinement layer 314 is thinner (e.g., around 250 nm) than the thick confinement layer 310 (e.g., around 6 um) to provide a thin p-side cladding 106 for beam collimation at the mesa 120 (e.g., a parabolic reflector).

Achieving a very thin p-side cladding for small for small μ-LED (e.g., <1 μm in Epi especially for red and IR-LED) with parabolic mesa shape is desirable, but very difficult to achive with high performance. Typical planar IR or red/yellow HighPower-LEDs have a much higher p-side thickness. Very thin p-side in epitaxial design uses careful optimization of carrier confinement, to reduce losses of electrons to the p-side and to realize high of IQE=90%, if possible.

In some embodiments, the thin confinement layer 312 has a thickness of T6 and the contact layer has a thickness of T7. T6 is between 5-50 nm (red: GaP or AlGaAs-contact+window layer with up to 20 μm thickness by HVPE), typical 10-100 nm, such as 20 nm. T7 has a thickness of between 50-2000 nm, typical 50-300 nm, such as 200 nm.

The contact layer 314 provides an interface to the p-contact 112 (e.g., including indium tin oxide (ITO) or metal) for the semiconductor structure 300. The contact layer 314 may be a transparent, gallium phosphide (GaP) layer, with p-type doping. The combination of the contact layer 314 and the thin confinement layer 414 results in a thin cladding 106 of having a thickness of less than 300 nm, typical 150-400 nm. In comparison, the thick cladding 104 has a thickness of over 1 um, such as between 2 um and 12 um.

In the example of FIG. 3, the thick cladding 104 is a "bottom" cladding grown on the substrate 302, and the thin cladding 106 is a "top" cladding grown over the thick cladding 104 and the light generation area 108. Subsequent to etching the mesa 120 into the semiconductor structure 300, the thin cladding 106 defines the side of the μLED 100 including the truncated top of the mesa 120 and the thick cladding 104 defines the side of the μLED 100 including the light emitting surface 118. As discussed in greater detail below in connection with FIGS. 12A through 12D, in some embodiments, the bottom cladding formed over the substrate may be a thin cladding and the top cladding formed over the bottom cladding may be a thick cladding. The top cladding may include the features as discussed herein for the thick cladding 104, and the bottom cladding may include features as discussed herein for the thin cladding 106. The substrate is removed from the semiconductor structure, and then the semiconductor structure is etched from the side including the thin bottom cladding to form a mesa and the side including the thick top cladding defines the light emitting surface. In some embodiments, the thin cladding includes n-type layers while the thick cladding includes p-type layers.

Returning to FIG. 2, the epitaxial structure 320 is etched 220 from the thin cladding 106 to the ESL 308 or current spreading layer 304 to form a mesa 120 and a base 124 in the epitaxial structure 320. For example, a dry etching processes, such as an inductively coupled plasma (ICP) etch, may be used to form the mesa 120 and the base 124. The ICP etch may be used to provide controllable isotropic or anisotropic etching by varying parameters to form the shape of the mesa 120 and the base 124, such as the parabolic, superparbolic, cylindrical, or conic shapes with or without truncated top. In some embodiments, an in-situ aluminum (Al)- or (P)-plasma fluorescence signal at the ESL 304 provides etch depth control during the ICP etch of the mesa 120 and the base 124.

Figure 3B:
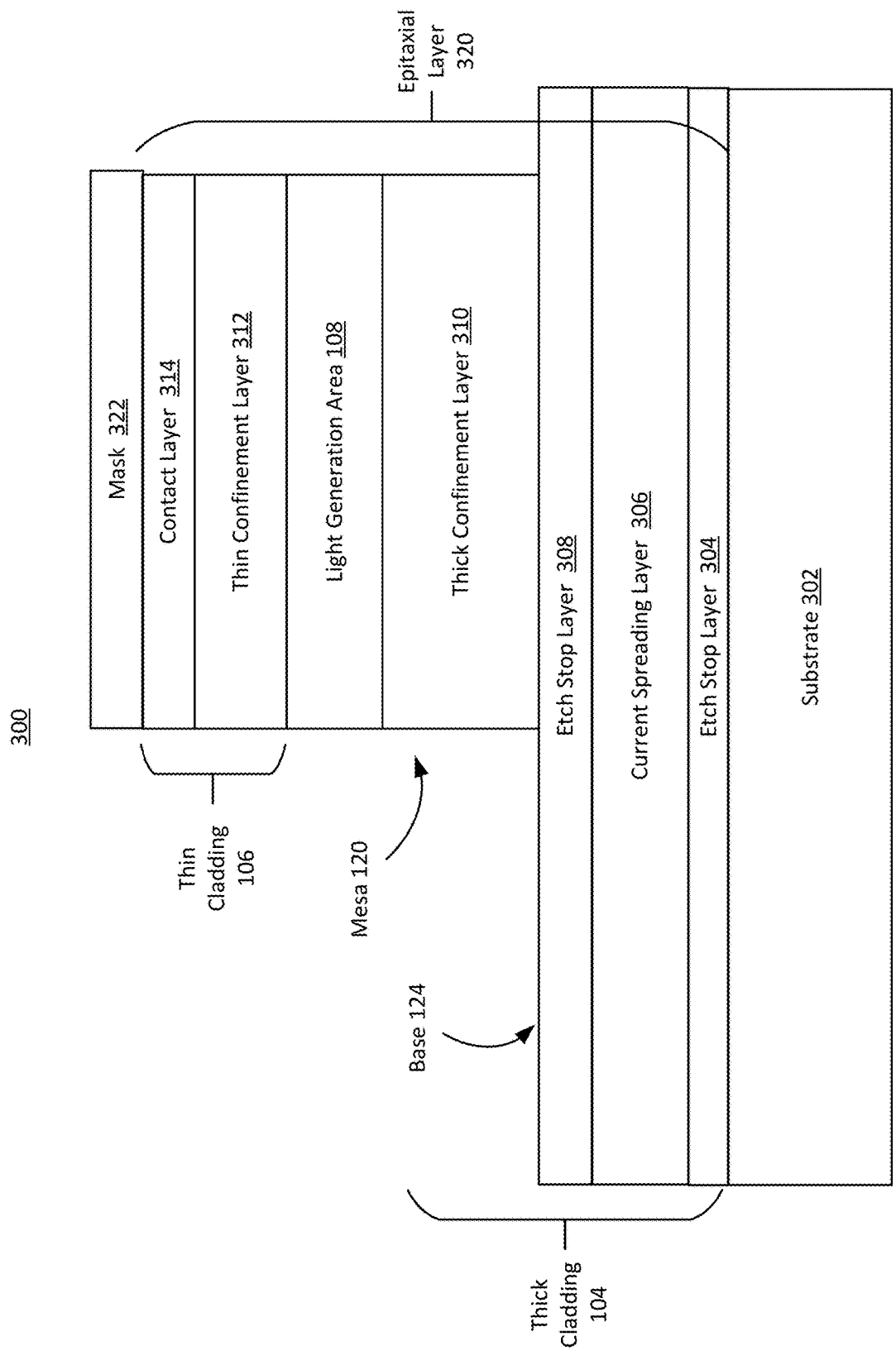

With reference to FIG. 3B, the contact layer 314 of the thin cladding 106 is patterned using a positive photo-resist mask 322 over a region of the semiconductor structure 300 to be formed into the mesa 120. The etch process is controlled to etch sloped side walls for the mesa 120 that define the shape of the mesa 120. For regions of the semiconductor structure 300 to be formed into the base 124, which are not protected by the photo-resist mask, the etching from the contact layer 314 of the thin cladding 106 is performed until reaching the thick cladding 104, in particular the ESL 308 of the thick cladding 104. In embodiments where the semiconductor structure 300 does not include the ESL 308, the etching may be performed until reaching the current spreading layer 306 or desired design depth. Additional details regarding using an etching process to form a mesa in a semiconductor structure are discussed in U.S. Pat. No. 7,598,148, titled "Micro-leds," issued Oct. 6, 2009, which is incorporated by reference herein in its entirety.

Figure 3C:
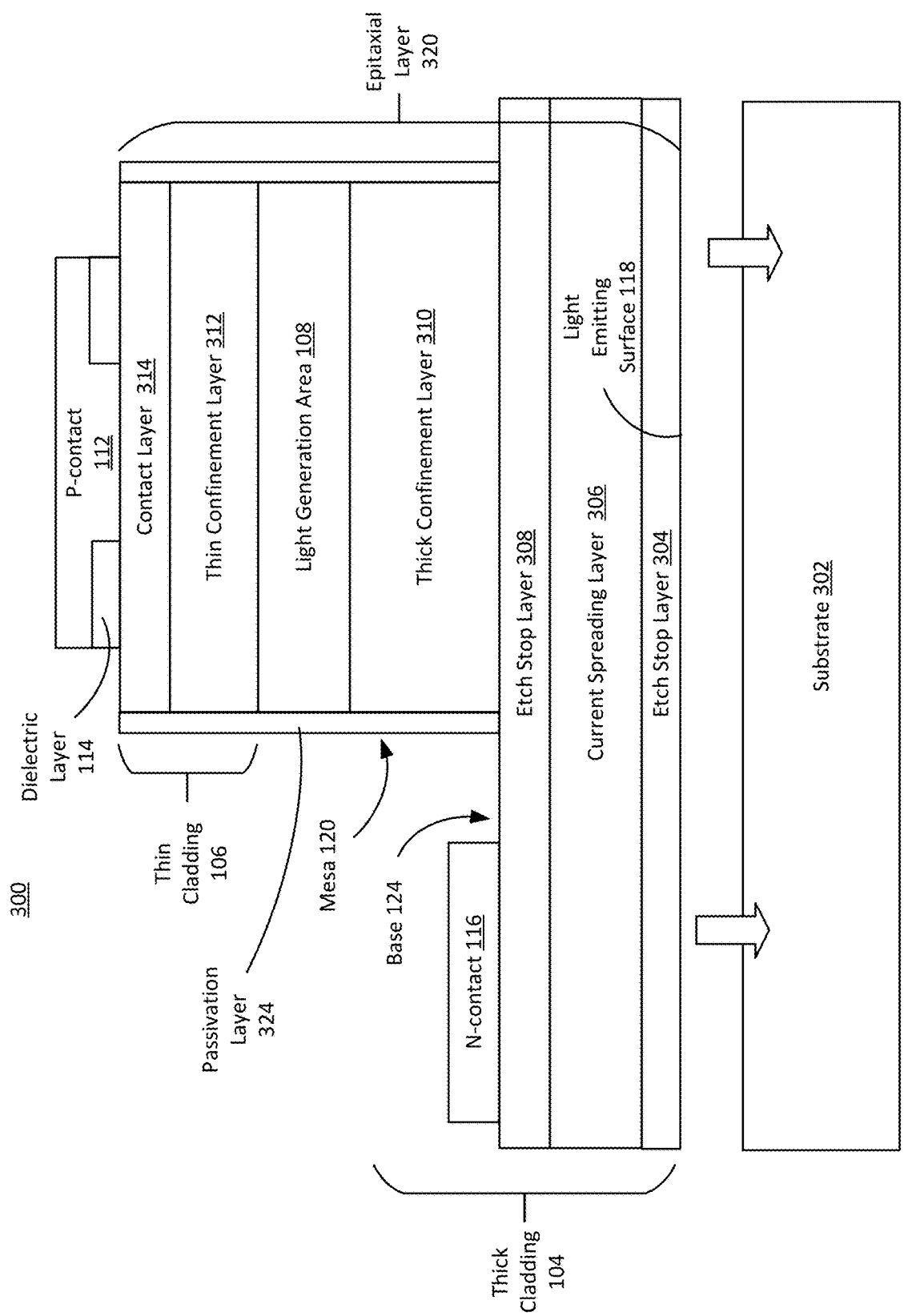

A dielectric layer 114 and a p-contact 112 is formed 230 on the mesa 120 and an n-contact 116 is formed 230 on the base 124. With reference to FIG. 3C, the mask 322 may be removed, and the dielectric layer 114 (e.g., +metal) may be formed on the mesa 120 which is etched into the semiconductor substrate 300. The p-contact 112 is formed on the dielectric layer 114. The p-contact 112 may extend through the dielectric layer 114 to contact a portion of the contact layer 314 of the thin cladding 106. In some embodiments, the p-contact includes ITO/metal or a metal stack.

In some embodiments, bumps may be formed, such as by electroplating) on top of the n-contact 116 or p-contact 112, but a gap (e.g., filled with air or electrical isolating material) between the bumps of the contacts 112, 116 to avoid electrical shortage.

In some embodiments, the n-contact 116, may be on the light emitting surface 118, on the etch stop layer 304, or on a locally recessed portions of the current spreading layer 306.

The substrate 302 is separated 240 from the epitaxial structure 320 to expose a light emitting surface 118 of the epitaxial structure 320. With reference to FIG. 3C, the substrate 302 may be separated from the epitaxial structure 320 using a wet etch, dry etch, or laser heating (e.g., laser-lift-off (LLO) or ablation) of the ESL 304. For example, the ESL 304 may include GaInP that is etched using HCl:H$_3$PO$_4$ (3:1). In other embodiments, the substrate 302 may be partially removed by grinding in a first step and/or selective wet etching of the substrate 302 in a second step. In some embodiments, the etching may include wet etching for GaAs, InP, or Si substrates, or inductively coupled plasma (ICP) etch, reactive ion etch (ME), or laser lift off (LLO) for a sapphire substrate. For example, the substrate 302 may include GaAs that is selectively etched using H$_3$PO$_4$:H$_2$O$_2$:deionized H$_2$O (3:1:25) with high selectivity. The ESL 304 may be used to prevent etching of the epitaxial structure, or may be omitted from the semiconductor structure 300.

In some embodiments, a semiconductor structure includes an array of µLEDs. An ICP etching or laser dicing may be used to singulate the µLEDs into individual dies, such as subsequent to the etching of the mesa 120 and prior to the removal of the substrate 302.

In some embodiments, a passivation layer 324 is formed on the side surface of the mesa 120. The passivation layer 324 may include a protective material, such as an oxide to protect the mesa 120 from damage.

Figure 3D:
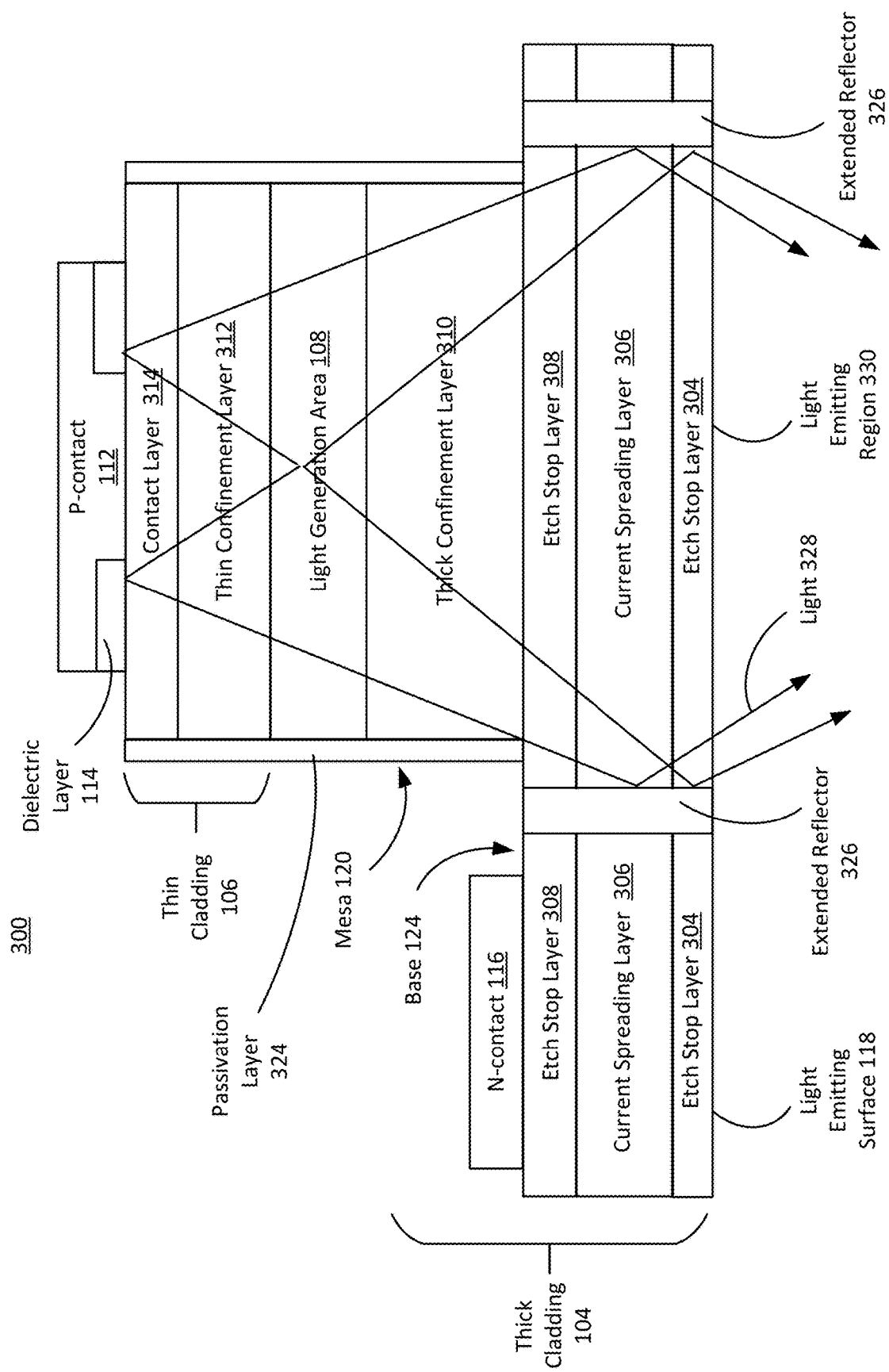

An extended reflector may be formed 250 in the base 124 of the epitaxial structure 320 below the mesa 120 to reflect and collimate light from the light generation area 108 toward the light emitting region 330 of the light emitting surface 118. With reference to FIG. 3D, the extended reflector 326 is formed from selectively etched apertures defined around a light emitting region 328 of the light emitting surface 118, and extending from the top of the base 124 (e.g., the bottom of the mesa 120) to the light emitting surface 118. The extended reflector 326 includes a different index of refraction and mesa/reflector etch profile than the layers of the base portion 124 to reflect light 328 emitted from the light generation area 108 and additionally collimate the light 328. The light 328 from the light generation area 108 may be reflected at the top of the mesa 120, where it is collimated, and then further collimated by the extended reflector 326 prior to transmission out of the light emitting surface 118 at the light emitting region 330. In some embodiments, the extended reflector 326 is formed by implantation of a material having lower index of refraction than the surrounding material of the base 124. In some embodiments, the extended reflector 326 is defined by air gaps formed in the base 124 by recess etching. In some embodiments, a reflective filling material having lower index of refraction than the surrounding material of the base 124 may be filled into the air gaps to define the extended reflector 326. In some embodiments, formation of the extended reflector 328 is omitted.

Figure 4A:
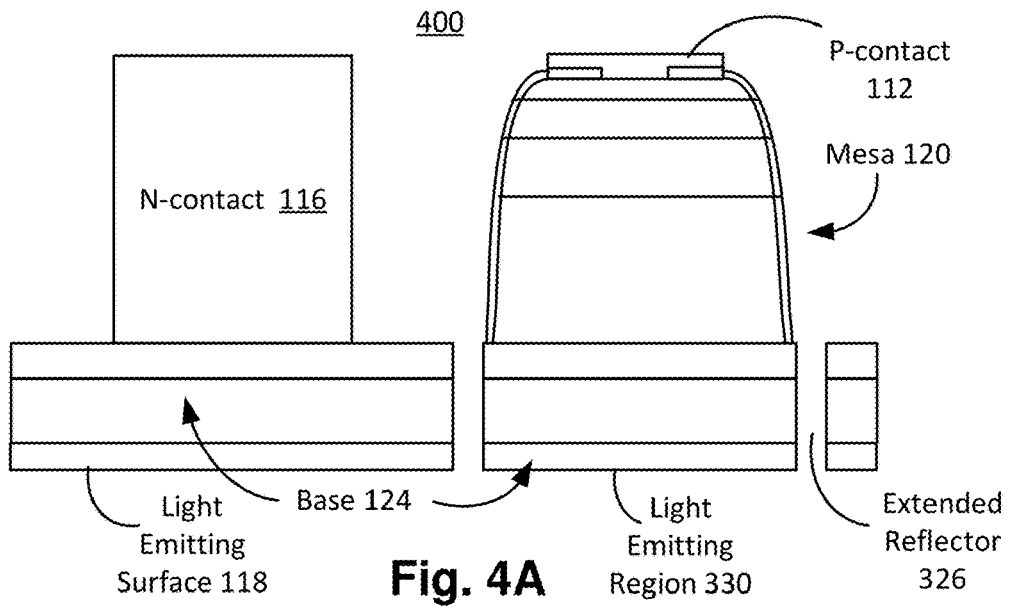
FIGS. 4A, 4B, and 4C respectively a show cross sectional side view, a top view, and a bottom view of a µLED including an extended reflector defined in an epitaxial structure, in accordance with one embodiment.
Figure 4B:
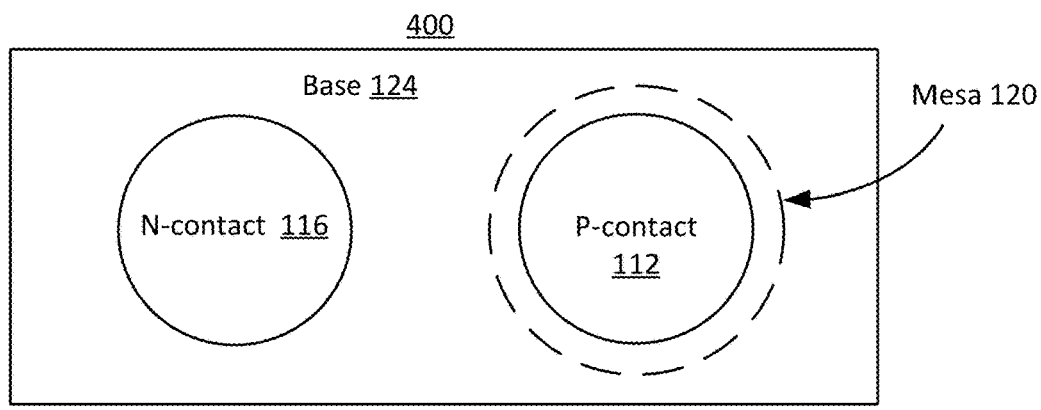
Figure 4C:
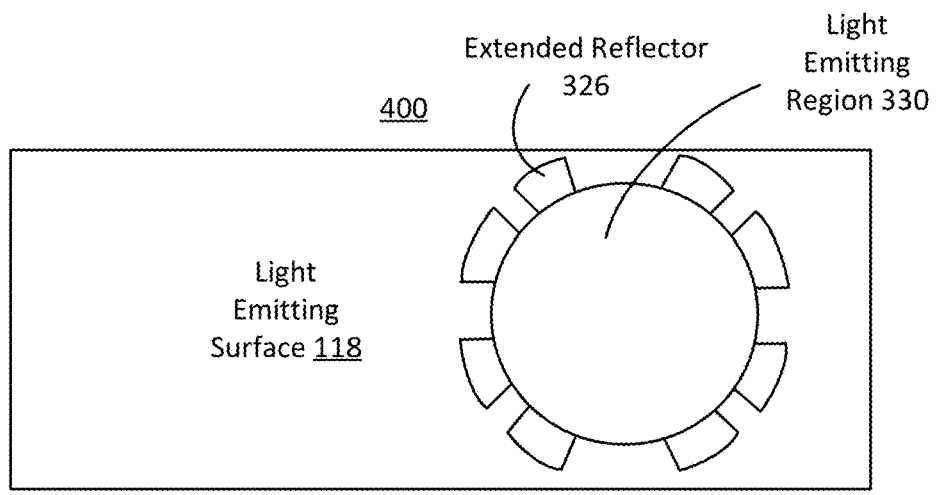

FIGS. 4A, 4B, and 4C are respective cross sectional, top, and bottom views of a µLED 400 including an extended reflector 326, in accordance with one embodiment. The discussion above regarding the µLED 100 may be applicable to the µLED 400. For example, the µLED 400 includes a parabolic mesa 120 rather than the cylindrical mesa 120 of the µLED 100, which may be formed by controlling the ICP etch (optional multi-etch steps and resist layers) when defining the mesa 120 in the epitaxial structure 320. A conductive material is formed on the n-contact 166 to form an extension (typically electroplated bumps AuSn, AuIn, etc.) that aligns the n-contact 116 with the p-contact 112. There may be a thick n-contact 116, or an n-contact with thicker electrical conductive metal bump to align with the p-contact 112. This allows the µLED 400 to be placed flat on a display substrate with the n-contact and p-contact on the backside 112 facing the display substrate without any wire bonds on front or backside needed and being electrically bonded to the display substrate. The display substrate may include a control circuit (CMOS-backplane) that controls the µLED 400 by providing signals via the p-contact 112 and n-contact 116. With reference to FIG. 4C, showing the bottom side of the µLED 400, the extended reflector 326 may be defined by spaced apart portions of reflective material formed around the light emitting region 330 of the light emitting surface 118.

µLED with Substrate Aperture for On-Wafer Testing

Figure 5:
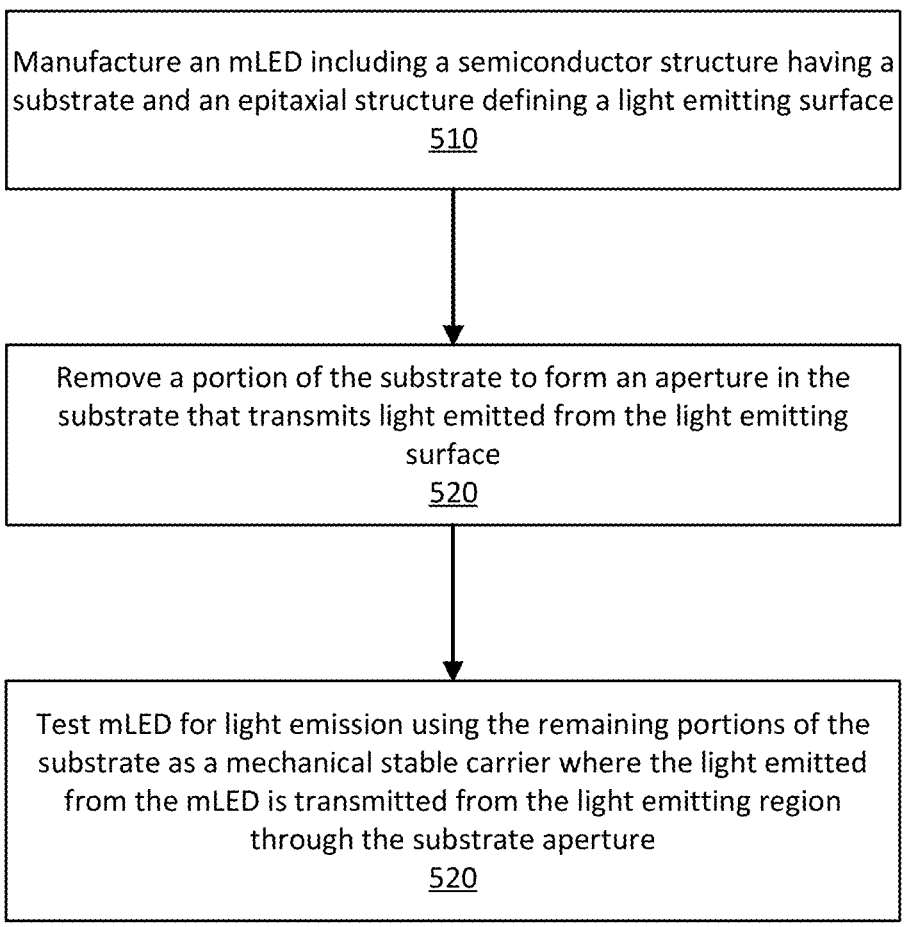
FIG. 5 is a flowchart of a process for manufacturing a µLED with a substrate aperture, in accordance with one embodiment.

FIG. 5 is a flowchart of a process 500 for manufacturing a µLED with a substrate aperture, in accordance with one embodiment. Rather than removing the entire non-transparent substrate to expose the light emitting surface of the µLED, a portion of the substrate covering the light emitting region on the light emitting surface of the µLED or µLED-array may be removed to define the substrate aperture to allow light to be transmitted from the light emitting region. The thinned (down to 50-150 µm) substrate remains attached to the µLED to provide a mechanically stable carrier, such as for wafer testing the µLED. The process 500 is discussed with reference to FIG. 6, which shows a µLED 600 including a substrate aperture 602, in accordance with one embodiment.

A µLED is manufactured 510, the µLED including a semiconductor structure having a substrate and an epitaxial structure defining a light emitting surface. For example, the LED may be manufactured using the processes of etching 210 through forming 230 the dielectric layer and the p-contact, as described above in detail with reference to FIG. 2.

Figure 6:
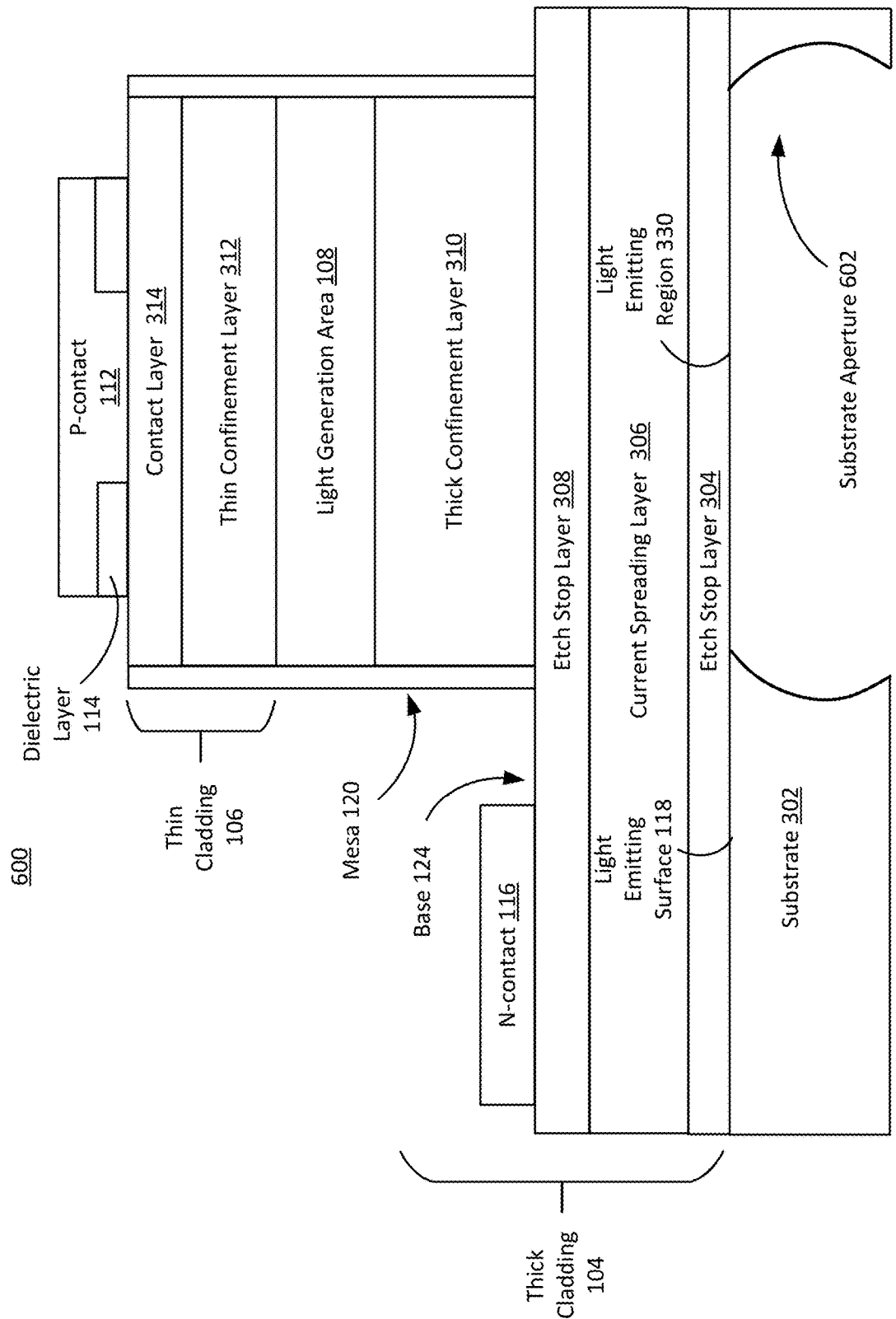
FIG. 6 is a cross-sectional diagram of a µLED including the substrate aperture, in accordance with one embodiment.

A portion of the substrate is removed 520 to form an aperture that transmits light emitted from the light emitting region of the light emitting surface. With reference to FIG. 6, the µLED 600 includes the substrate aperture 602 formed in the substrate 302. Portions of the substrate 302 may be removed using a selective wet etching of the GaAs substrate to the etch stop layer 304. The substrate aperture 602 exposes the light emitting region 330 of the light emitting surface 330. In some embodiments, the substrate material is removed at other (e.g., passive, non-light emitting) regions substrate 302. The portions of the substrate 302 that are not removed serves as a mechanical stable carrier support for the µLED 600.

The µLED is tested 530 for light emission using the remaining portions of the substrate as a mechanical stable carrier, where the light emitted from the µLED is transmitted from the light emitting region through the substrate aperture 602 in the testing. For example, a signal is provided to the µLED through the p-contact 112 and the n-contact 116 to cause the µLED to emit light, which is captured by an optical sensor to test the optical properties of the µLED. The substrate 302 with the substrate aperture 602 provides for on-wafer testing of the µLED. In some embodiments, µLED are manufactured in 1D or 2D-arrays and tested (before or after singulation) using on-wafer testing as discussed in the process 500. The µLED which pass the testing are selected for pick and place onto a display substrate (or an intermediate carrier substrate), while µLED that fail the testing are not selected for placement on the display substrate. Thus, on-wafer testing can be used to avoid the picking and placing of µLED having defects from the manufacturing process. Multiple µ-LEDs for 1 pixel may compensate defect of single µ-LEDs.

In some embodiments, the substrate is removed subsequent to the on-wafer testing. In other embodiments, the substrate is kept attached to the epitaxial structure of the µLED, and the µLED is pick and placed onto the display substrate with the substrate attached because the light from the µLED is emitted from the substrate aperture.

µLED with Extended Substrate Reflector

FIG. 7 is a flowchart of a process 700 for manufacturing a µLED with an extended substrate reflector, in accordance with one embodiment. The µLED may include an extended substrate reflector formed in the substrate. For example, apertures may be etched in the substrate with shapes that form reflectors, such as extended parabolic (e.g., for a narrow/focused beam) or inclined (e.g., for a wider Lambertian beam) mirrors for beam shaping of the light emitted from the µLED. The process 700 is discussed with reference to FIGS. 8A and 8B, which respectively shows a µLED 800 and a µLED 850 including an extended substrate reflector 802, in accordance with one embodiment. The process 700 is also discussed with reference to FIGS. 9A, 9B, and 9C, which respectively show a cross-sectional side view, a top view, and a bottom view of a µLED 900 including the extended substrate reflector, in accordance with one embodiment.

A µLED is manufactured 710, the µLED including a semiconductor structure having a substrate and an epitaxial structure defining a light emitting surface. For example, the LED may be manufactured using the processes of etching 210 through forming 230 the dielectric layer and the p-contact, as described above in detail with reference to FIG. 2.

A portion of the substrate is removed 720 to form a light reflector shape in the substrate to collimate light emitted from the light emitting region of the light emitting surface. For example, a portion of the substrate may be removed to expose the light emitting region of the light emitting surface, and to form the light reflector shape. The portion of the substrate 302 may be removed using a selective wet etching of the GaAs substrate to the etch stop layer 304 to define the light reflector shape. Example shapes suitable for collimating light may include extended parabolic or inclined shapes.

Figure 8A:
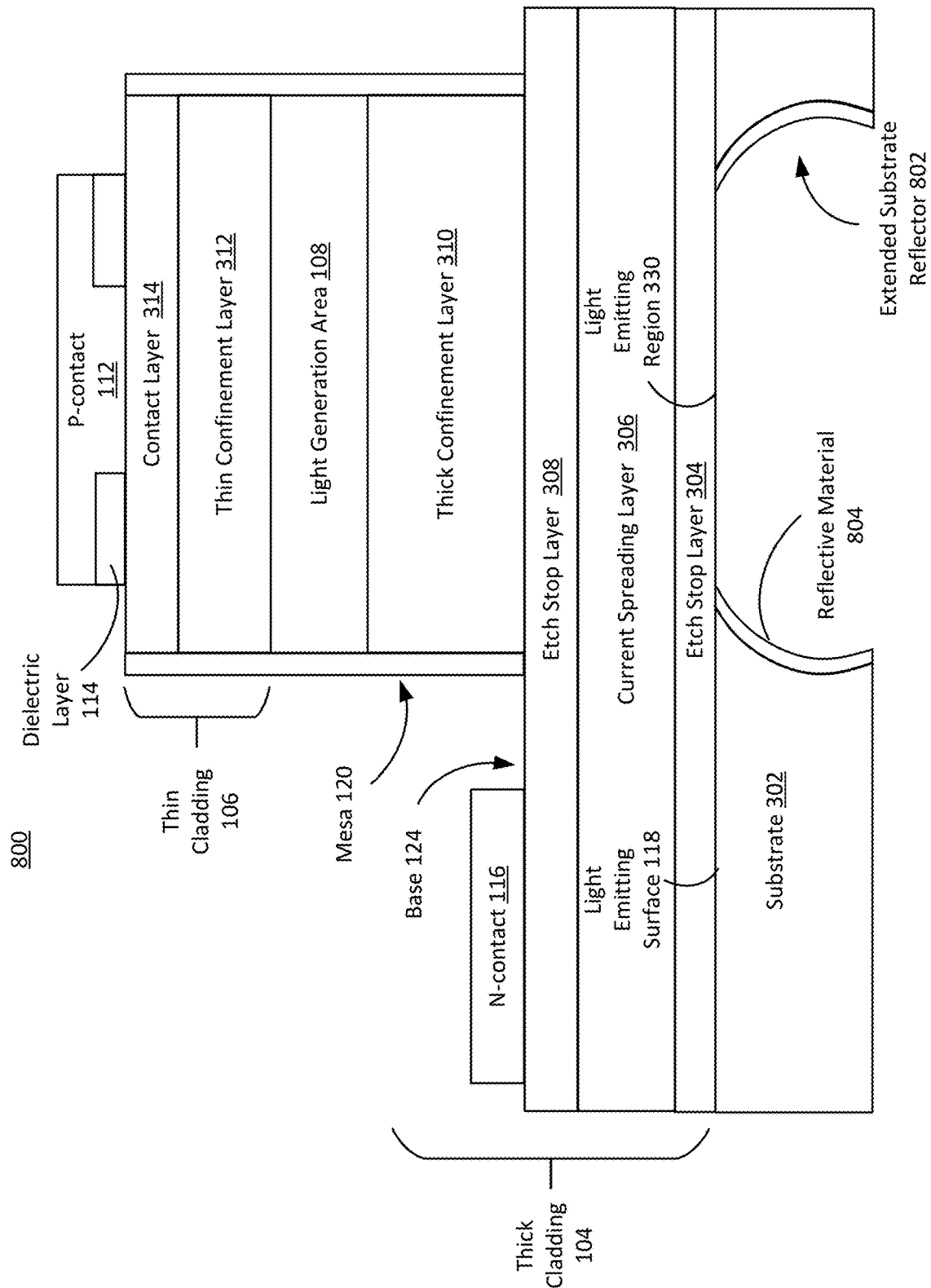
FIGS. 8A and 8B are cross-sectional diagrams of µLEDs including extended substrate reflectors, in accordance with one embodiment.

A reflective material is formed 730 on a surface of the substrate defining the light reflector shape to collimate light transmitted from the light emitting surface. With reference to FIG. 8A, the µLED 800 includes an extended substrate reflector 802 formed in the substrate 302. The extended substrate reflector 802 has a parabolic light reflector shape, and includes a reflective material 804 on the surface of the substrate reflector 802. The reflective material 804 is reflective for the light emitted from the light emitting surface 118, and facilitates collimation of the light. In some embodiments, the reflective material 804 includes light-reflecting coating layers such as silicon nitride (SiN) or silicon oxide (SiO) and reflecting metal like silver (Ag), aluminum (Al) for ultraviolet (UV) or visible light, and gold (Au) for red+infrared (IR) light on the wall the light absorbing substrate (e.g. GaAs for red µLEDs).

Figure 8B:
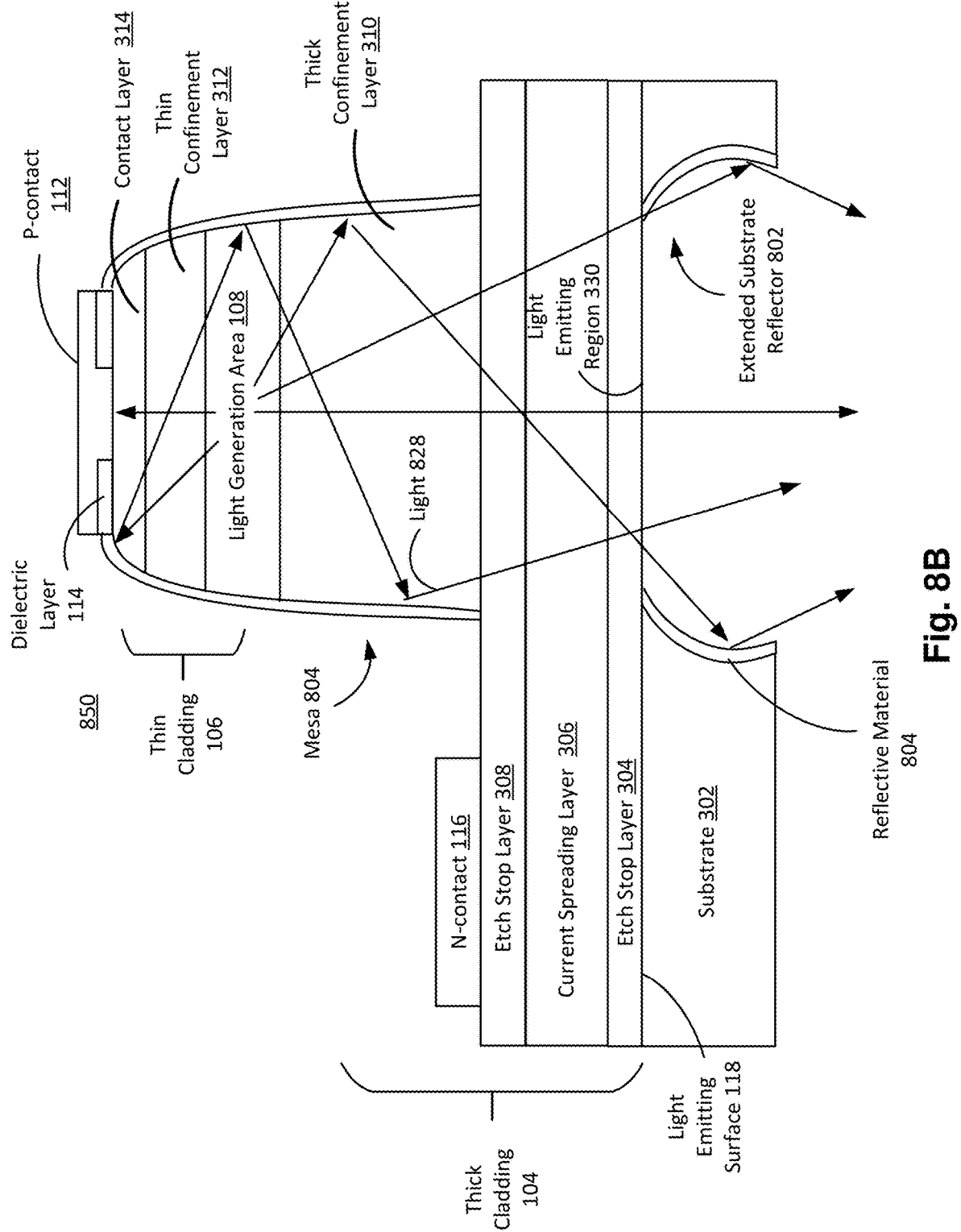

With reference to FIG. 8B, the µLED 850 also includes the extended substrate reflector 802 formed in the substrate 302. µLED 850 further has a parabolic mesa 804. The light generation area 108 of the µLED 100 emits light 828. Some of the light is emitted toward the mesa 804, where it is collimated and reflected toward the light emitting region 330. The light 828 is transmitted from the light emitting region 330. A portion of the transmitted light 828 incident on the reflective material 804 of the extended substrate reflector 802 is reflected and collimated as output light of the µLED 850.

Figure 9A:
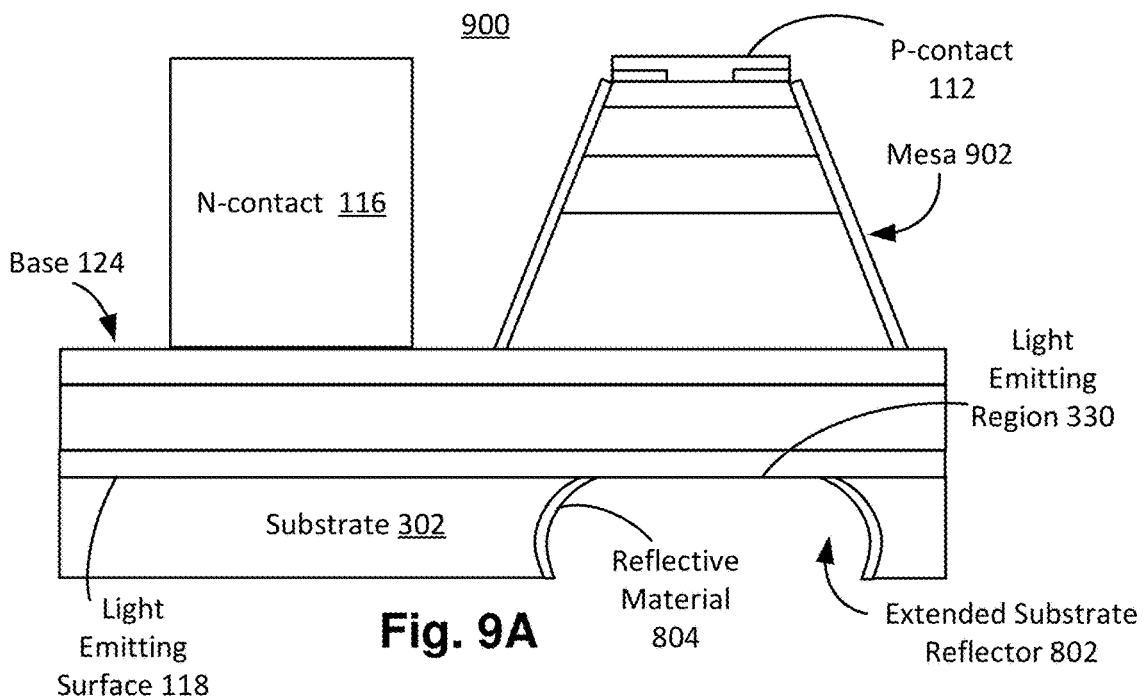
FIGS. 9A, 9B, and 9C respectively a show cross sectional side view, a top view, and a bottom view of a µLED including the extended substrate reflector, in accordance with one embodiment.
Figure 9B:
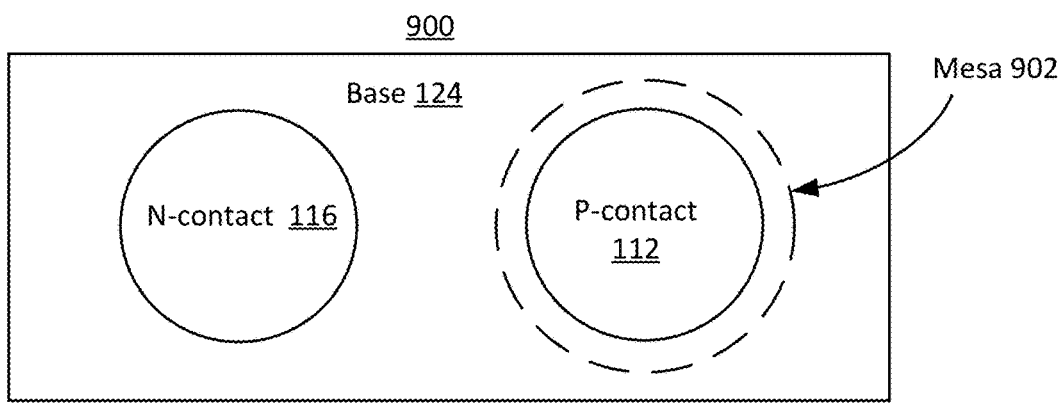
Figure 9C:
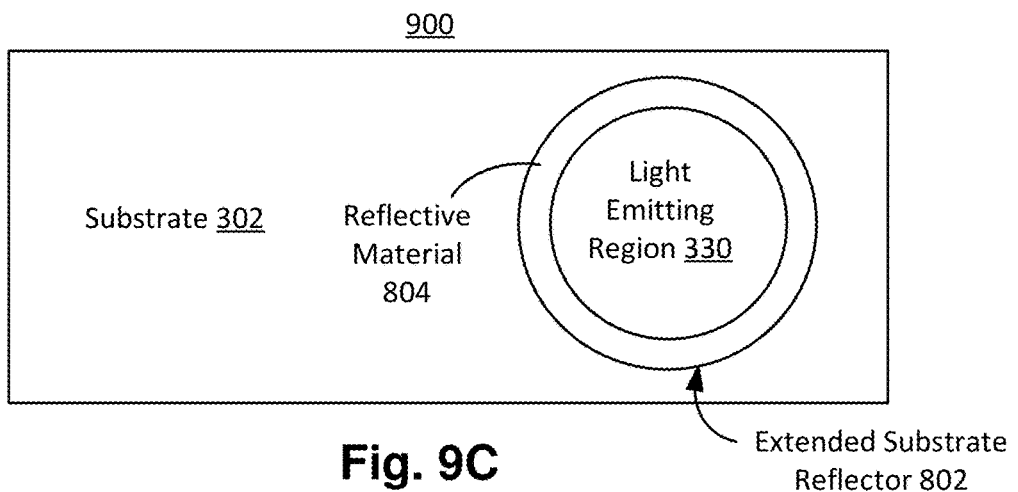

FIGS. 9A, 9B, and 9C are respective cross sectional, top, and bottom views of a µLED 900 including the extended substrate reflector 802, in accordance with one embodiment. The µLED 900 includes a mesa 902 having conic shape with a truncated top to provide an inclined reflector in the mesa 902. As discussed above, the shape of the mesa 902 may be formed by controlling the ICP etch when defining the mesa in the epitaxial structure 320. With reference to FIG. 9C, the extended substrate reflector 802 defined in the substrate 302 includes the reflective material 804 forming a reflective surface around the light emitting region 330. In some embodiments, the extended substrate reflector has some other shape such as an inclined shape rather than the parabolic shape shown for the extended substrate reflector 802.

Additional Examples of μLEDs

Figure 10:
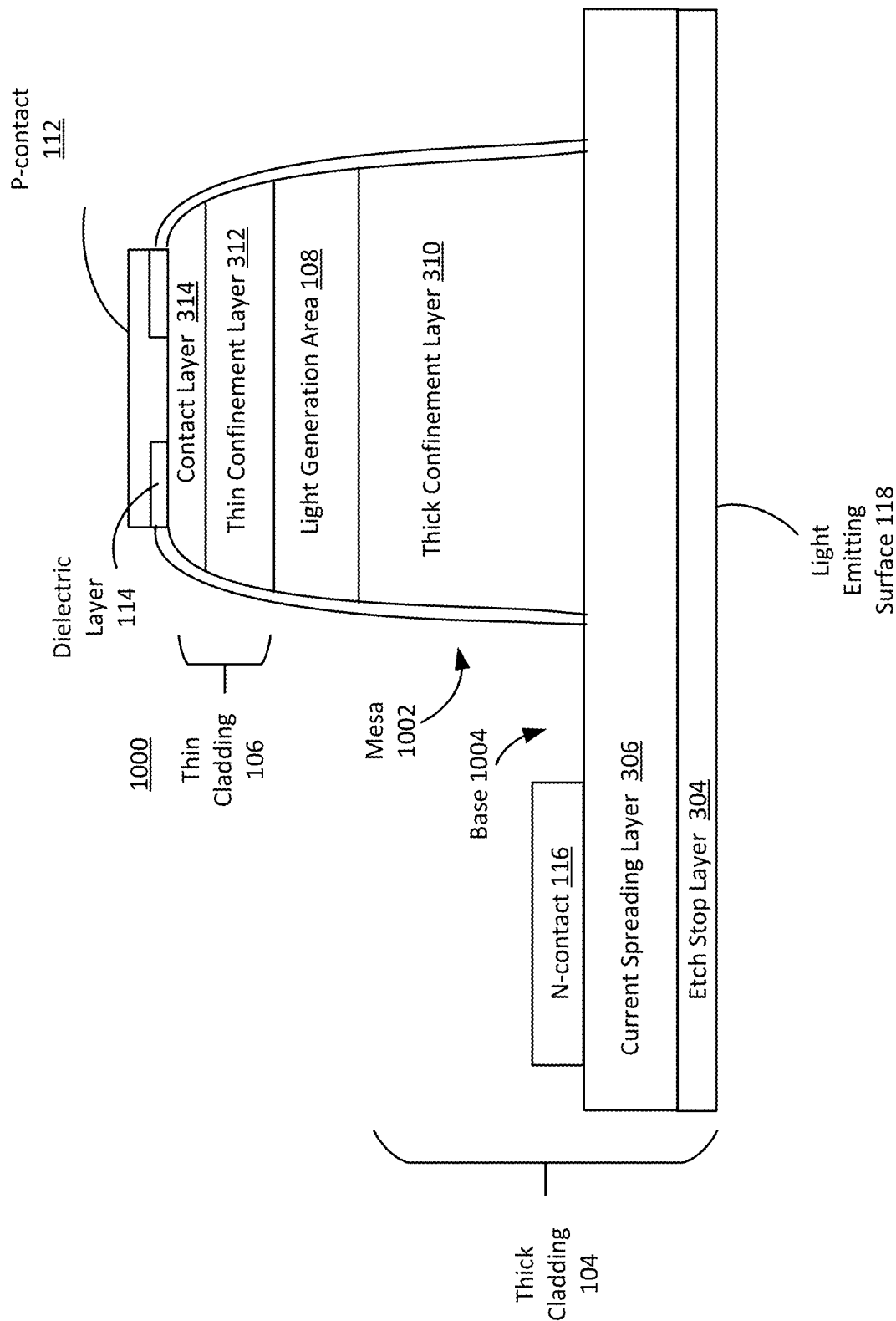
FIG. 10 is a cross-sectional diagram of an example µLED, in accordance with one embodiment

FIG. 10 is a μLED 1000, in accordance with one embodiment. The μLED 1000 has a thick confinement layer 310 formed on a current spreading layer 306. The ESL 308, such as shown in FIG. 3C, is omitted, and the thick confinement layer 310 is on the current spreading layer 306 when the semiconductor structure is manufactured. To form the mesa 1002 and the base 1004, the semiconductor structure is etched. Because there is no ESL 308, a timed etch may be used to for depth control. The N-contact 116 is formed on the current spreading layer 306 rather than the ESL 308.

In this example, the μLED 1000 has a parabolic shape with a truncated top, but other light collimating structures or shapes may be used.

Figure 11:
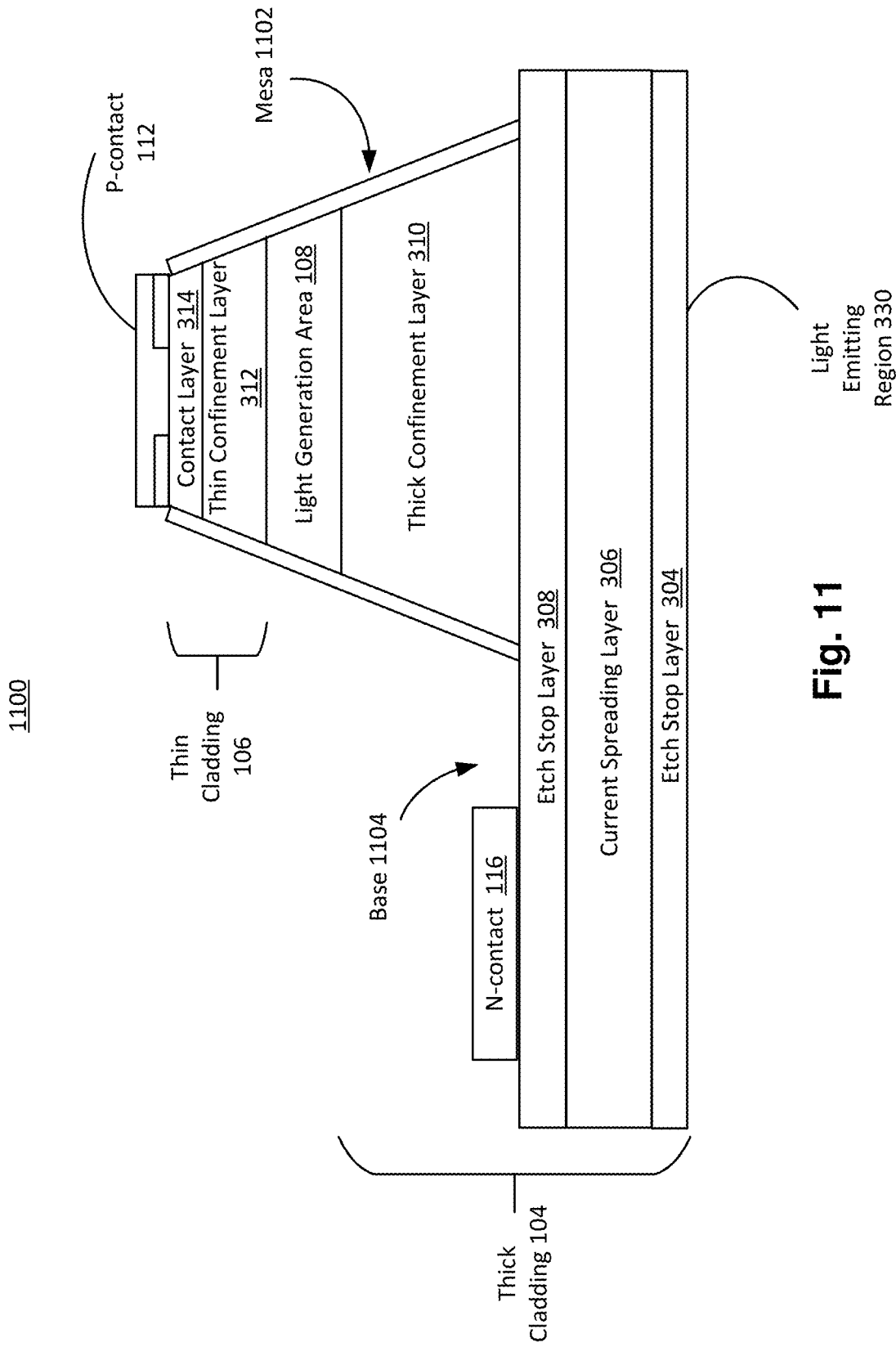
FIG. 11 is a cross-sectional diagram of an example µLED, in accordance with one embodiment

FIG. 11 is a μLED 1100, in accordance with one embodiment. The μLED 1100 has a mesa 1102 having a conic shape with a truncated top. The mesa 1102 includes inclined reflector mesa side walls to improve light extraction efficiency and wider beam divergence/viewing angle (e.g., for a 2 dimensional display application) than a mesa with a parabolic shape.

In various embodiments, a μLED with substrate removed may include an extended reflector. In other embodiments, a substrate is attached to the light emitting surface 118 of the μLED as discussed herein, with one or more apertures formed in the substrate to facilitate on-wafer testing or to provide an extended substrate reflector.

Top or Bottom Side Fabrication of μLED

As discussed in the process 200, a μLED can be manufactured by forming an epxitaxial layer on a substrate, the epitaxial structure including a thick cladding on the substrate, a light generation area on the thick cladding, and a thin cladding over the light generation area. The epitaxial structure on the thin cladding side opposite the substrate is then etched to form the mesa and base. The substrate may then be removed. In other embodiments, a thin cladding is over the substrate, the light generation area is over the thin cladding, and a thick cladding is over the light generation area. The substrate is removed after formation of the epitaxial structure, and then the mesa and base are etched into the epitaxial structure from the thin cladding side where the substrate is removed. As discussed in the process 200 the semiconductor structure 300 used to form the μLED includes a p-type thin cladding and an n-type thick cladding. In other embodiments, the thin cladding is n-type and the thick cladding is p-type.

Figure 12B:
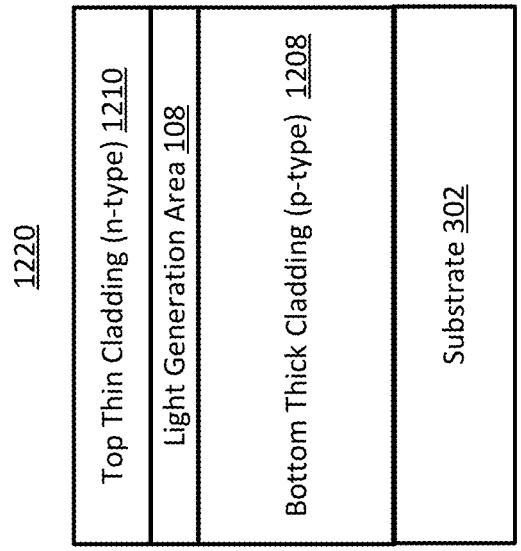
FIGS. 12A, 12B, 12C, and 12D are semiconductor structures used to form a µLED, in accordance with some embodiments.
Figure 12A:
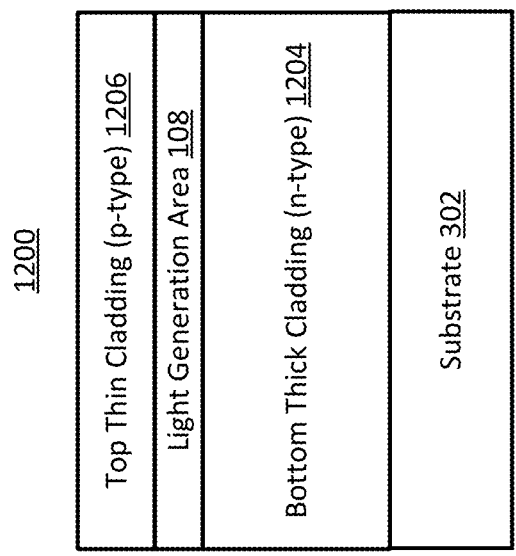

FIGS. 12A, 12B, 12C, and 12D are cross sections of semiconductor structures 1200, 1220, 1240, and 1260, respectively, which may be used to form a μLED. With reference to FIG. 12A, the semiconductor structure 1200 includes the substrate 302, an n-type bottom thick cladding 1204 on the substrate 302, the light generation area 108 on the n-type bottom thick cladding 1204, and a p-type top thin cladding 1206 on the light generation area 108. With reference to FIG. 12B, the semiconductor structure 1220 includes the substrate 302, an p-type bottom thick cladding 1208 on the substrate 302, the light generation area 108 on the p-type bottom thick cladding 1204, and an n-type top thin cladding 1206 on the light generation area 108. The semiconductor structures 1200 and 1220 may be etched from the top thin cladding to form a mesa. The substrate 302 may remain attached during the formation of the mesa.

Figure 12D:
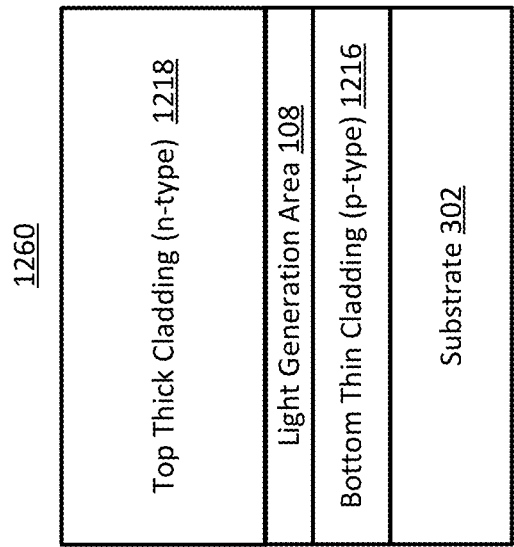
Figure 12C:
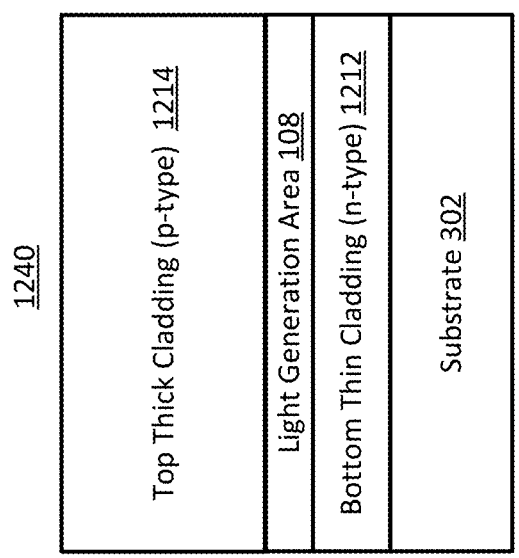

With reference to FIG. 12C, the semiconductor structure 1240 includes the substrate 302, an n-type bottom thin cladding 1212 on the substrate 302, the light generation area 108 on the n-type bottom thin cladding 1212, and a p-type top thick cladding 1214 on the light generation area 108. With reference to FIG. 12D, the semiconductor structure 1260 includes the substrate 302, a p-type bottom thin cladding 1216 on the substrate 302, the light generation area 108 on the p-type bottom thin cladding 1216, and an n-type top thick cladding 1218 on the light generation area 108. The substrate 302 may be removed, and the semiconductor structures 1200 and 1220 may be etched from the bottom thin cladding to form a mesa.

Multi-Quantum Well Structure

FIG. 13 is a cross-sectional view of a μLED 1300, in accordance with one embodiment. The μLED 1300 includes a mesa 1320 and a base 1324. The mesa 1320 has a height of between 5 and 10 um, and a width of between 5 and 20 um. In the mesa 1320, the light generation area 108 includes a quantum well (QW) active region 1306 defined at the center of the light generation area 108, and a QW edge region 1308 defined outside of the active region 1306 to the outer edge of the mesa 1320. The QW active region 1306 emits a front emission cone 1302 of direct light, and the edge region 1308 emits an edge emission cone 1304 of indirect light.

The light generation area 108 may emit light in multiple directions, with a portion of the light being emitted upwards through the thin confinement layer 132 and the contact layer 314, reflected at the top of the mesa 1320 by the reflective contact 1324 (e.g., an n-type or p-type contact depending on the doping of the thin confinement layer 132 and contact layer 314) downwards through the thin confinement layer 132 and the contact layer 314, and through the base 1324 for emission from the μLED 1300. Another portion of the light is emitted downwards through the thick confinement layer and base 1324 for emission from the μLED 1300.

The reflective contact 1324 is a reflector metal mirror, and may include a thin layer of palladium (Pd), platinum (Pt), nickel (Ni), silver (Ag), or gold (Au) to improve reflectivity. In some embodiments, Ag is be used for a UV, blue, green, and red μLED 1300, and Ag or gold (Au) may be used for an infrared μLED 1300 to achieve high metal reflectivity and low absorption for the emitted wavelength of light. For example, a blue μLED may include an Ag mirror or a Pd mirror, the Ag mirror being 20-30% more reflective than the Pd mirror.

The structure and location of the quantum wells in the light generation area 108 can be optimized in various ways to, among other things, improve extraction efficiency, current confinement, and reduce non-radiative absorption and lateral light reabsorption.

In some embodiments, the light generation area 108 is positioned in antinodes of the electric field of light reflected at the mesa 1320 (e.g., off the reflective contact 1324) to provide higher light extraction efficiency from constructive light interference within the front light emission cone 1302. The location of the light generation area 108 within the mesa 1320 and with respect to the reflective contact 1324 may be set to decrease destructive interference and increase constructive interference between light backreflected from the backside reflective contact 1324, and the light emitted towards the light emitting surface 118. In some embodiments, a quantum well is positioned at a parabolic focal point of the mesa 1320. In some embodiments, the quantum wells may use cavity effects (such as thin cavities less than 1 um in size).

In some embodiments, the μLED 1300 has a reflective metal layer on top of the dielectric layer 114 (electrical isolation in pn-area). The reflective metal layer may be different from the metal layer of the reflective contact 1324, such as a metal layer stack with improved adhesion and reflection characterisitics.

In some embodiments, the reflector layers (typically dielectric layer+metals) deposited on the mesa facet and on top flat area to reflect the other part of light for higher LEE. The edge emission cone 1304 based on light reflected at mesa 1320 is typically optimized for a narrow beam profile with much smaller beam divergence (5-30°,<60°) than typical Lambertian type High-Power LEDs or mini/μ-LEDs with planar, vertical mesa shape and a beam profile of HWHM>±60°. The narrow beam profile of parabolic or conical μ-LEDs is beneficial for more efficient coupling of light into optics and mobile applications like AR.

Figure 15:
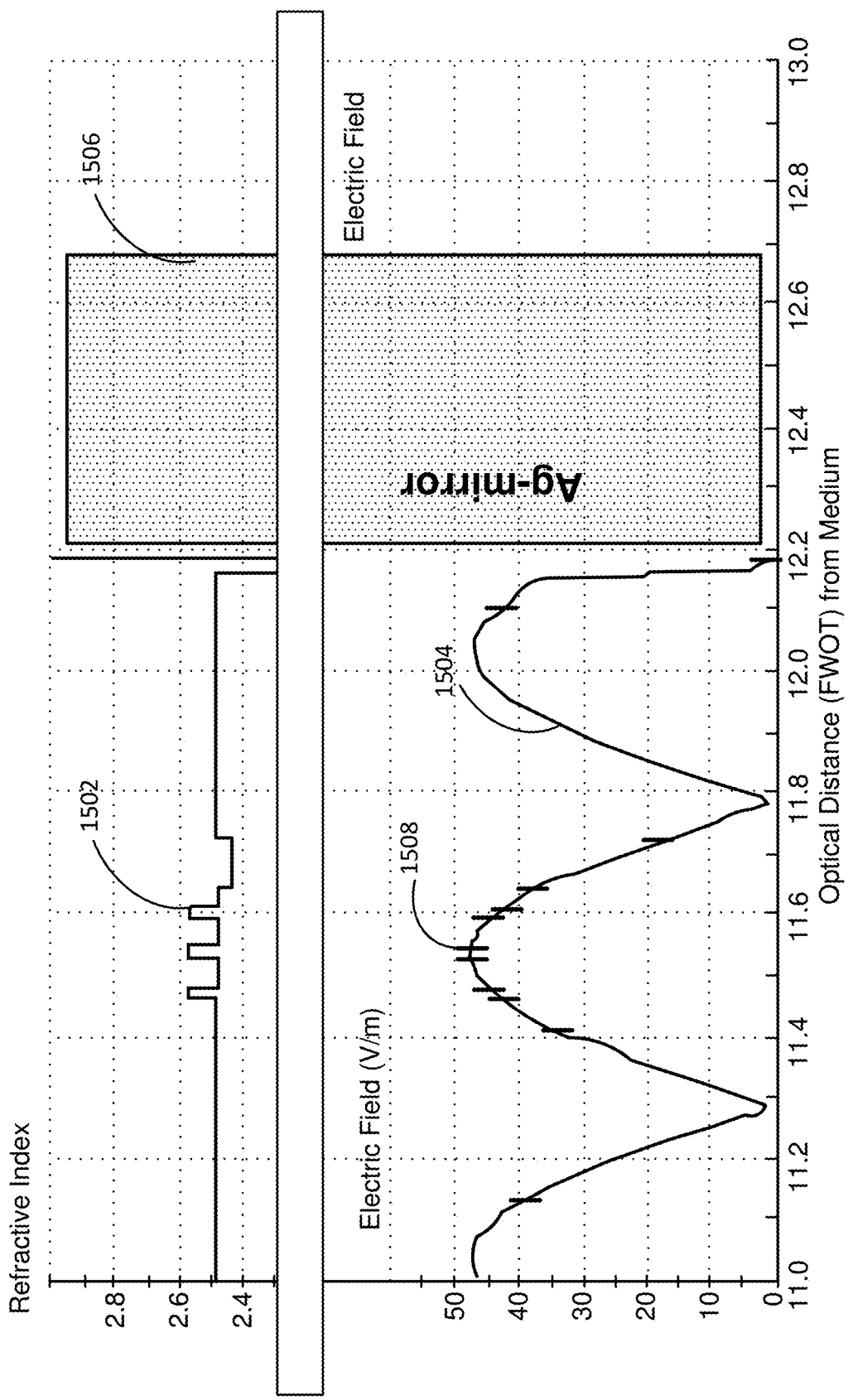
FIG. 15 is a chart showing Transfer-Matrix-Simulations of positions of quantum wells relative to an electric field of a µLED, in accordance with some embodiment.

FIG. 15 is a chart 1500 showing Transfer-Matrix-Simulations of the positions of quantum wells 1502 relative to an electric field 1504 of a μLED, in accordance with some embodiment. The upper graph shows the refractive index marking the individual positions of the quantum wells 1502 in close distance to the Ag-mirror 1506 on the back side. On the same scaled is the optical wave or electric field 1504 in the lower graph shown. Every layer interface is marked by a short black vertical line. The boundary of thin QWs 1502 are marked by 2 of these black lines close to each other. The center one of the three QWs 1502 is placed at the antinode 1508. The two surrounding QWs 1502 are separated by the thin QB-barrier layer are still close to the top of the antinode 1508 of the standing wave. Light emitted inside the QWs 1502 that travels towards the backside and reflected at the Ag-mirror 1506 is in constructive interference with light that is emitted directly to the front surface.

In some embodiments, the light generation area 108 includes quantum wells having a single quantum well (SWQ), double quantum well (DQW), or triple quantum well (TQW)-epi-design for high peak internal quantum efficiency (IQE) at lower current (e.g., less than 1 uA). In some embodiments, the quantum wells may include quantum dots for vertical and lateral confinement of μLEDs with smaller width (e.g., diameter less than 5 um). The quantum dots may suppress lateral diffusion of carriers towards the etched mesa surface with parasitic surface recombination. The vertical current spreading and inhomogeneous carrier transport over several quantum wells is reduced.

In some embodiments, the quantum wells in the QW active region 1306 have low dislocation density and low impurity levels. For example, the quantum wells may include threading dislocation density (TDD) less than $3\times10^8$ $cm^{-2}$ for hetero-epitaxy like GaN-on-Si, and TD less than $3\times10^7$ $cm^{-2}$ for homo-epitaxy like GaN-on-GaN. The quantum wells may also include low impurity levels (e.g., Oxygen, Carbon, etc. concentration less than $10^{17}$ $cm^{-2}$). As such, the light generation area 108 has low non-radiative absorption (A*N) for high peak IQE at low current (e.g., 1 nA to 1 uA) for the μLED 1300.

In some embodiments, the lower defect density in the light generation area 108 is achieved using a lower defect level of improved buffer growths (GaN-on-sapphire heteroepitaxy: 1) critical nucleation temperature, 2) slow recovery and growth rate of crystal-growth with boundaries between micro-crystals acting as sources of defects and 3) coalescence layer at higher growth T. A thicker coalescence layer and buffer improves the threading dislocation density (TDD≥$1\times10^8$ $cm^2$) but could also lead to higher strain and wafer bow. Additional SiN-micromasking layer could further improve the TDD, due to interrupt the GaN-buffer growth and recovery of GaN as a new coalescence layer afterwards. These techniques are able to reduce the defect density from $1\times10^{10}$ $cm^2$ down to $1\times10^8$ $cm^2$. Lower TDD is possible with ELO-growth or on bulk like GaN-substrates (e.g., HVPE) with TDD being between $1\times10^4$ $cm^2$ and $1\times10^7$ $cm^2$.

In some embodiments, the light generation area 108 includes quantum well intermixing at the QW edge region 1308 defined outside the MQW active region 1306 of the μLED 1300. For example, the QW edge region 1308 may include unstrained quantum wells and strained quantum wells. The unstrained quantum wells include a bandgap of Eg and the strained quantum wells include a higher bandgap of Eg">Eg to provide lateral carrier localization in the QW active region 1306 of the μLED 1300, and helps to reduce lateral carrier losses and parasitic surface recombination at the QW edge region 1308 toward the edge of the mesa 1320. As such, lateral light reabsorption in the light generation area 108 is reduced.

In some embodiments, the quantum wells at the QW edge region 1308 include strained quantum wells to provide a strain induced shift of the bandgap to larger Eg" relative to unstrained quantum wells in the QW active region 1306 having bandgap Eg. The mesa edge effect on strain may be in the order of less than 2 to 3 um. For example, the μLED 1300 may be a red color μLED using a tensile strained quantum well design, such as GaInP or AlGaInP with less In relative to strain-free lattice-matched InGaP or AlGaInP quantum wells. Higher Eg"> Eg in the QW edge region 1308 results in lateral carrier localization in the QW active region 1306 at the inner portion of the μLED 1300 and reduces lateral carrier losses and parasitic surface recombination in the QW edge region 1308.

Figure 14:
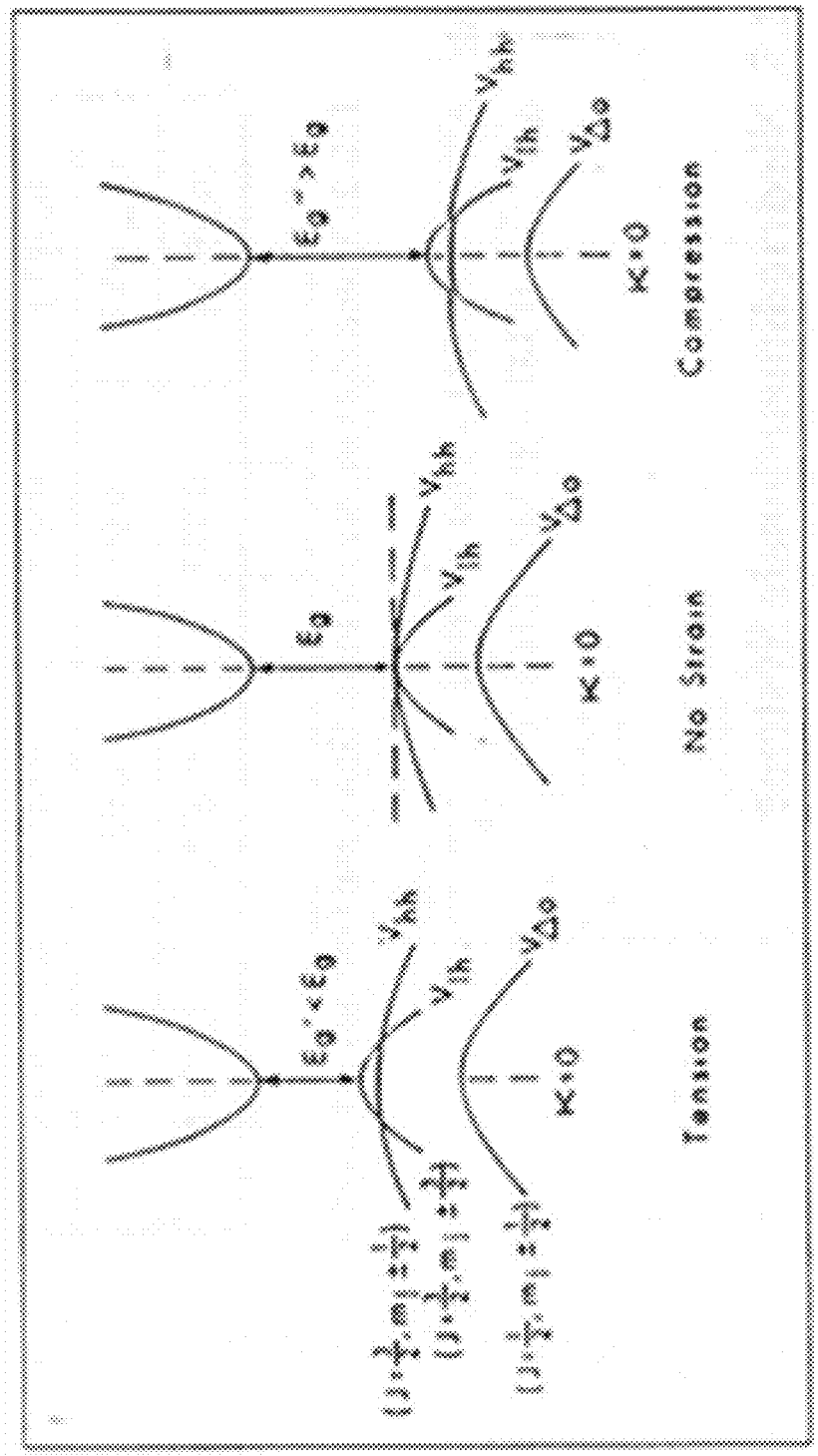
FIG. 14 is a bandgap diagram of strained and unstrained quantum wells, in accordance with one embodiment.

FIG. 14 is a bandgap diagram 1400 of a quantum well, in accordance with one embodiment. The bandgap diagram includes the bandgaps for tension and compression strained quantum wells, and the bandgap for an unstrained quantum well. The tension strained quantum well has a bandgap defined by Eg'<Eg, the unstrained quantum well has a bandgap defined by Eg, and the compression strained quantum well has a bandgap defined by Eg">Eg. Vhh refers to the valence band for heavy holes, Vhl refers to the valence band for light holes. Vdeltao refers to split off valence band needed for calculation of hole transistion for different strain.

The AlGaInP QWs are typically used for red LEDs. In some embodiments, highly tensile strained GaInP QWs may be used. Due to partial relaxation of GaInP-QWs at etched mesa facet, the strain is less tensile, resulting in higher bandgap in a small ring at the mesa facet. The strain releases at the soft etched mesa facet without the generation of new crystal defects.

In some embodiments, the μLED 1300 is a red LED with optimized position of quantum wells in the light generation area 108 for high front emission. The red μLED may include a group of three or fewer quantum wells per antinode in the electric field of the light for constructive interference of light emitted in quantum wells with backside reflected light by the reflective contact 1324. For higher internal quantum efficiency at lower current, favorable increase of current density can be realized by design with less quantum wells and/or thinner quantum wells. In some embodiments, the red μLED includes a silver (Ag) reflective contact 1324. The light generation area 108 may include a TQW in an antinode with 523 nm optical distance to the reflective contact 1324 without surface roughening. In another example, the light generation area 108 may include three SQW in an antinode with 543 nm optical distance to the reflective contact 1324 without surface roughening. Optical distance is a function of distance (d) and material properties such as the refractive index (n).

In some embodiments, light extraction efficiency for the red μLED is improved with reduction of the thin cladding (e.g., p-side) thickness to less than 400 nm. For TQWs, the optical distance to the reflective contact may be 365 nm. For SQWs, the optical distance to the reflective contact may be 385 nm.

In some embodiments, the μLED 1300 is a green LED with optimized position of quantum wells in the light generation area 108 for high front emission. The reflective contact 1324 may include a silver (Ag) mirror. The light generation area 108 may include three SQWs or a TQW in an antinode with 134 nm optical distance to the reflective contact 1324 without surface roughening.

In some embodiments, the μLED 1300 is a blue LED with optimized position of quantum wells in the light generation area 108 for high front emission. The reflective contact 1324 may include Ag. In some embodiments, the light generation area 108 for the blue LED may include seven equally spaced quantum wells in an antinode with 75 nm optical distance to the reflective contact 1324 without surface roughening. This results in constructive interference of emitted light and higher external quantum efficiency (EQE) in a 44 degree front emission cone 1302. However, other layer designs may provide more optimal efficiency. If the light generation area 108 includes surface roughening the distance to the reflective contact 1324 or other parameters may be adjusted accordingly.

In some embodiments, the light generation area 108 for the blue LED may include three TQWs in an antinode with 99 nm distance to the reflective contact 1324 without surface roughening. This results in constructive interference of emitted light and higher EQE in a 25 degree front emission cone 1302. The position of QWs in an antinode of optical wave very close to the backside may depend on the wavelengths of light and the corresponding refractive index of the semiconductor material in epitaxial design.

In some embodiments, the light generation area 108 for the blue LED may include a SQW in an antinode with 111 nm optical distance to the reflective contact 1324 without surface roughening. This results in constructive interference of emitted light and higher EQE in a 25 degree front emission cone 1302.

Low and High Current Density

The design of a μLED may vary based on desired current density. For low current density (e.g., 2D μLED display architecture), between 1 and 3 quantum wells may be used for blue or green color μLEDs, and 1 and 5 quantum wells may be used for red color μLEDs. Furthermore, large quantum well thicknesses may be used. For example, a green color μLED may include quantum well thicknesses of between 2.2 and 3.2 nm, a blue color μLED may include quantum well thickness of between 2.5 and 4.5 nm (e.g., 3.5 nm for highest efficiency), and a red color μLED may include quantum well thickness of between 8 and 15 nm for highest efficiency (e.g., to minimize current density and Auger-losses).

For high current density (e.g., 1D μLED display architecture with a factor 1000 higher brightness or current needed than the 2D architecture), between 3 and 7 quantum wells may be used for green or blue color μLEDs, and between 6 and 30 quantum wells may be used for red color μLEDs. Furthermore, thinner quantum well thicknesses may be used than for low current density. For example, a green color μLED may include quantum well thicknesses of between 1.5 and 2.5 nm (e.g., for highest efficiency and to minimize blue-shift with higher current density). A blue color μLED may include quantum well thickness of between 1.8 and 2.8 nm (e.g., 2.3 nm) to minimize the blue-shift with higher current density and achieve shorter carrier lifetime through less surface recombination. A red color μLED may include quantum well thickness of between 5 and 15 nm for highest efficiency. Small Red μ-LED has no wavelength shift up to for high current density.

In some embodiments, a (e.g., 620 nm) red color μLED may include tensile strained InGaP quantum wells instead of AlGaInP quantum wells. In some embodiments, the red color μLED includes tensile strained InGaP-quantum wells and compressive strained AlGaInP quantum barriers.

Infrared μLED

An infrared μLED (e.g., at λ=940 nm) may include a center quantum well positioned about 300 nm to the top surface of a GaAs substrate 302. The infrared μLED may include an active region without tensile strained GaAsP quantum barriers for strain compensation of compressively strained InGaAs quantum wells. The epitaxial structure 320 may be grown on the GaAs substrate 302 in <100> without off-orientation.

The infrared μLED may further include confinement layers 310, 312 including AlGaAs (e.g., aluminum content X=40%). The thickness of the AlGaAs layer is corrected for constructive light interference. The heterointerfaces are graded by a 20 nm layer to reduce potential barriers for carriers for lowest forward voltage and highest wall-plug-efficiency (pwe).

The quantum well may be positioned to achieve constructive light interference of vertical reflected light from a backside mirror, like Silver (Ag) as a conductive p-metal mirror. Multiple quantum wells may be grouped in an antinode of the electric field of light reflected by the mirror. Furthermore, the optical layer thickness (n*d) of various layers in the epitaxial structure may be selected to achieve the constructive light interference of light that is emitted from the MQWs in the active region and reflected back from the backside reflector (for example electrical conductive p-side Ag/Au-metal mirror).

The current spreading layer 306 may include n-doped GaAs. A thick n-doped GaAs current spreading layer 306 without or with only partial n-GaAs-substrate 302 removal may lead to higher optical losses due to free carrier absorption for 940 nm light emission. As such, an n-AlGaAs current spreading layer 306 or undoped nid-GaAs-substrate 302 could be an alternative and is aligned with the chip-design of the IR μLED.

In some embodiments, an improved material quality of multiple compressively strained InGaAs quantum wells can be realized by the use of tensile strained GaAsP layers as quantum barriers for strain compensation.

In some embodiments, the alternation of compressively strained InGaAs quantum wells with tensile strained GaAsP quantum barrier on <100> GaAs substrates (e.g., exact orientation <±0.25° off) allows for growth of up to 50 MQWs with excellent material and optical properties. The P-content in the GaAsP barrier layer is optimized for good electron and hole confinement in the InGaAs quantum well. The GaAsP barrier layer thickness is calculated to compensate the compressive strain of the InGaAs quantum well.

The surface and crystal orientation of the GaAs-substrate 302 has an impact on material growth of highly strained InGaAs/GaAsP MQWs. The crystal surface could lead to step bunching at the monoatomic surface steps in the case of an off-orientation of the wafer surface from (100) GaAs. IR μLED with improved designs for high output power and performance use the growth of highly strained InGaAs QWs that is independent of the number of QWs to minimize non-radiative Auger losses at higher current densities with less QWs.

In some embodiments, using strain compensation (e.g., compressive strained InGaAs QWs and tensile strained GaAsP quantum barrier), an IR μLED having higher output power (>factor 2×) can be realized with 8-20×MQWs up to very high current densities. In contrast, single side compressively strained InGaAs MQW LEDs outputting light at 940 nm are often limited to 3-5 QWs for material quality and performance reasons.

In some embodiments, a red or infrared μLED includes a very thin cladding 106 (e.g., p-side) and a parabolic mesa. Conventional large planar red High-Power-LED chips have much thicker p-side for better e-blocking and confinement in the active region. For example, the thin cladding may be less than 300 nm for a small parabolic mesa (e.g., less than 10 μm in diameter). The QW-position should match also with the parabolic mesa shape design. For example, a quantum well may be positioned at a parabolic focal point of the mesa, or at an antinode of light reflected by a reflective contact. The thick current spreading layer is transparent for the light from the light emitting area (T>80%).

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A light emitting diode (LED), comprising:
   an epitaxial structure defining:
      a base defining a light emitting surface of the LED, the base including a current spreading layer with a first-type doping;
      a mesa on the base, the mesa including:
         a first confinement layer with the first-type doping;
         a light generation area on the first confinement layer to emit light;
         a second confinement layer on the light generation area with a second-type doping opposite the first-type doping;
         a contact layer with the second-type doping on the second confinement layer, the contact layer defining a top of the mesa, the second confinement layer being thinner than the first confinement layer; and
      a reflective contact on the contact layer to reflect a portion of the light emitted from the light generation area to the light emitting surface,
   wherein the LED has a light emitting area between 0.2-10 μm in diameter.

2. The LED of claim 1, wherein the epitaxial structure is grown on a non-transparent substrate.

3. The LED of claim 2, wherein the non-transparent substrate includes one of silicon (Si) or gallium arsenide (GaAs).

4. The LED of claim 1, wherein the mesa is a substantially vertical mesa.

5. The LED of claim 1, wherein the mesa is a substantially conical mesa.

6. The LED of claim 1, wherein the mesa is a substantially parabolic mesa.

7. The LED of claim 1, wherein the first-type doping is n-type doping and the second-type doping is p-type doping.

8. The LED of claim 1, wherein the first-type doping is p-type doping and the second-type doping is n-type doping.

9. The LED of claim 1, wherein the first confinement layer is thicker than the light generation area.

10. The LED of claim 1, wherein the second confinement layer is thicker than the light generation area.

11. A method of manufacturing a light emitting diode (LED), comprising:
    forming an epitaxial structure defining:
       a mesa including a light generation area configured to generate light; and
       a base including:
          a light emitting surface at a first side of the base, the mesa being on a second side of the base opposite the first side, the light emitting surface including a light emitting region; and
          a plurality of air gaps in the base or reflective filling material in the base, the plurality of air gaps or the reflective filling material partially surrounding the light emitting region and defining an extended reflector, the extended reflector reflecting and collimating the light from the light generation area propagating through the base; and
    forming a reflective contact on the mesa.

12. The method of claim 11, wherein the epitaxial structure is grown on a non-transparent substrate.

13. The method of claim 12, wherein the non-transparent substrate includes one of silicon (Si) or gallium arsenide (GaAs).

14. The method of claim 11, wherein the mesa is a substantially vertical mesa.

15. The method of claim 11, wherein the mesa is a substantially conical mesa.

16. The method of claim 11, wherein the mesa is a substantially parabolic mesa.

17. The method of claim 11, wherein the first-type doping is n-type doping and the second-type doping is p-type doping.

18. The method of claim 11, wherein the first-type doping is p-type doping and the second-type doping is n-type doping.

19. The method of claim 11, wherein the first confinement layer is thicker than the light generation area.

20. The method of claim 11, wherein the second confinement layer is thicker than the light generation area.

* * * * *

UNITED STATES PATENT AND TRADEMARK OFFICE
CERTIFICATE OF CORRECTION

Page 1 of 1

PATENT NO. : 10,847,675 B2
APPLICATION NO. : 16/598498
DATED : November 24, 2020
INVENTOR(S) : Lutgen et al.

It is certified that error appears in the above-identified patent and that said Letters Patent is hereby corrected as shown below:

On the Title Page

Item (54), in Column 1, in "Title", Line 1, delete "EMITING" and insert -- EMITTING --, therefor.

Item (57), in Column 2, under "Abstract", Line 1, delete "A emitting" and insert -- A light emitting --, therefor.

In the Specification

In Column 1, Line 1, delete "EMITING" and insert -- EMITTING --, therefor.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*